(12) United States Patent
Aono et al.

(10) Patent No.: US 8,816,969 B2
(45) Date of Patent: Aug. 26, 2014

(54) INPUT APPARATUS

(75) Inventors: Tomotake Aono, Yokohama (JP); Yuta Shiokawa, Yokohama (JP); Kaoru Tashiro, Yokohama (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 13/001,553

(22) PCT Filed: Dec. 21, 2009

(86) PCT No.: PCT/JP2009/007079
§ 371 (c)(1),
(2), (4) Date: Dec. 27, 2010

(87) PCT Pub. No.: WO2010/073596
PCT Pub. Date: Jul. 1, 2010

(65) Prior Publication Data
US 2011/0102355 A1    May 5, 2011

(30) Foreign Application Priority Data

Dec. 22, 2008 (JP) ................................ 2008-326281
Dec. 22, 2008 (JP) ................................ 2008-326311
Dec. 22, 2008 (JP) ................................ 2008-326316

(51) Int. Cl.
*G06F 3/041* (2006.01)

(52) U.S. Cl.
USPC ...................... 345/173; 178/18.01; 340/407.1

(58) Field of Classification Search
USPC ......... 345/173–178; 178/18.01–18.09, 18.11; 463/30; 340/4.12, 407.1, 407.2; 715/702
See application file for complete search history.

(56) References Cited

U.S. PATENT DOCUMENTS

| 4,766,271 | A | 8/1988 | Mitsuhashi et al. |
| 5,977,867 | A | 11/1999 | Blouin |
| 6,067,081 | A | 5/2000 | Hahlganss et al. |
| 6,118,435 | A | 9/2000 | Fujita et al. |
| 6,337,678 | B1 * | 1/2002 | Fish ............................. 345/156 |
| 6,822,635 | B2 | 11/2004 | Shahoian et al. |
| 6,937,124 | B1 * | 8/2005 | Nakamura et al. ............ 335/222 |

(Continued)

FOREIGN PATENT DOCUMENTS

| CN | 1582465 | 2/2005 |
| EP | 1 388 874 | 2/2004 |

(Continued)

OTHER PUBLICATIONS

JPO, International Search Report, mailed Mar. 2, 2010 in PCT/JP2009-007079 (corresponds to U.S. Appl. No. 12/979,223).

(Continued)

*Primary Examiner* — Stephen Sherman
(74) *Attorney, Agent, or Firm* — Workman Nydegger

(57) ABSTRACT

An input apparatus has an input unit for receiving a pressure input, a load detection unit for detecting a pressure load on the input unit, a vibration unit for vibrating the input unit, and a control unit for controlling drive of the vibration unit such that a click sensation is provided to an object pressing the input unit when the pressure load detected by the load detection unit satisfies a predetermined standard for receiving an input to the input unit. Thereby, a realistic click sensation similar to that obtained when a push-button switch is operated is provided upon operation of the input unit of a pressure type by an operator.

3 Claims, 22 Drawing Sheets

(56) References Cited

U.S. PATENT DOCUMENTS

| | | | |
|---|---|---|---|
| 7,084,859 B1* | 8/2006 | Pryor | 345/173 |
| 7,119,798 B2* | 10/2006 | Yoshikawa et al. | 345/173 |
| 7,215,329 B2* | 5/2007 | Yoshikawa et al. | 345/173 |
| 7,292,227 B2* | 11/2007 | Fukumoto et al. | 345/173 |
| 7,443,384 B2* | 10/2008 | Harada et al. | 345/173 |
| 7,525,415 B2* | 4/2009 | Yatsu et al. | 340/407.2 |
| 2003/0067449 A1* | 4/2003 | Yoshikawa et al. | 345/173 |
| 2003/0231170 A1* | 12/2003 | Yoshikawa et al. | 345/173 |
| 2004/0061688 A1* | 4/2004 | Nakayama et al. | 345/173 |
| 2004/0178996 A1* | 9/2004 | Kurashima et al. | 345/173 |
| 2005/0219230 A1* | 10/2005 | Nakayama et al. | 345/173 |
| 2006/0119586 A1 | 6/2006 | Grant et al. | |
| 2007/0146334 A1 | 6/2007 | Inokawa | |
| 2008/0042994 A1 | 2/2008 | Gillespie et al. | |
| 2008/0084384 A1 | 4/2008 | Gregorio et al. | |
| 2008/0100177 A1 | 5/2008 | Dai et al. | |
| 2008/0122315 A1 | 5/2008 | Maruyama et al. | |
| 2009/0015555 A1 | 1/2009 | Takashima et al. | |
| 2009/0228791 A1 | 9/2009 | Kim et al. | |
| 2009/0237364 A1 | 9/2009 | Bloomcamp et al. | |
| 2011/0102358 A1 | 5/2011 | Aono et al. | |
| 2011/0148795 A1 | 6/2011 | Aono et al. | |
| 2011/0163984 A1 | 7/2011 | Aono et al. | |
| 2011/0169758 A1 | 7/2011 | Aono et al. | |
| 2011/0260991 A1 | 10/2011 | Aono et al. | |
| 2013/0027324 A1 | 1/2013 | Martin et al. | |

FOREIGN PATENT DOCUMENTS

| | | |
|---|---|---|
| EP | 1 544 720 | 6/2005 |
| EP | 1 967 290 A1 | 9/2008 |
| JP | 08-221173 | 8/1996 |
| JP | 10-293644 | 11/1998 |
| JP | 2003-288158 | 10/2003 |
| JP | 2005-149197 | 6/2005 |
| JP | 2005-258666 | 9/2005 |
| JP | 2005-332063 | 12/2005 |
| JP | 2008-130055 | 6/2008 |
| WO | WO 2006/042309 | 4/2006 |
| WO | 2008/125130 A1 | 10/2008 |
| WO | WO 2008/116547 | 10/2008 |

OTHER PUBLICATIONS

JPO, Notification of Reasons for Refusal, mailed May 11, 2010 in JP 2008-326316 (corresponds to U.S. Appl. No. 12/979,223).
JPO, Notification of Reasons for Refusal, mailed May 11, 2010 in JP 2008-326297 (corresponds to U.S. Appl. No. 13/001,591).
JPO, Notification of Reasons for Refusal, mailed May 11, 2010 in JP 2009-177070 (corresponds to U.S. Appl. No. 12/979,231).
JPO, Office Action, mailed May 11, 2010 in JP 2009-177079 (corresponds to U.S. Appl. No. 13/001,595).
JPO, Office Action, mailed Oct. 4, 2011 in JP 2008-326281.
JPO, Office Action, mailed Oct. 4, 2011 in JP 2008-326311.
U.S. Appl. No. 12/979,223, May 18, 2011, Office Action.
U.S. Appl. No. 12/979,223, Sep. 26, 2011, Final Office Action.
U.S. Appl. No. 13/001,591, Apr. 22, 2011, Office Action.
U.S. Appl. No. 13/001,591, Aug. 4, 2011, Final Office Action.
U.S. Appl. No. 13/001,591, Oct. 7, 2011, Advisory Action.
U.S. Appl. No. 13/001,570, Oct. 18, 2011, Office Action.
U.S. Appl. No. 12/979,231, Apr. 19, 2011, Office Action.
U.S. Appl. No. 12/979,231, Aug. 10, 2011, Final Office Action.
U.S. Appl. No. 12/979,231, Jan. 4, 2012, Notice of Allowance.
U.S. Appl. No. 13/001,595, Sep. 29, 2011, Office Action.
KIPO Office Action, mailed Jul. 9, 2012 in KR 10-2012-7002429.
U.S. Appl. No. 12/979,223, Aug. 13, 2012, Notice of Allowance.
U.S. Appl. No. 13/001,595, Aug. 2, 2012, Office Action.
Supplementary European Search Report dated Dec. 17, 2012 in 10804118.7-1233 / 2461233 PCT/JP2010004796.
Supplementary European Search Report dated Dec. 19, 2012 in 10804122.9-2224 / 2461235 PCT/JP2010004800.
KIPO Office Action, mailed Jan. 23, 2013 in KR 10-2011-7014258.
KIPO Office Action, mailed Jan. 23, 2013 in KR 10-2011-7014259.
Laitinen et al., Enabling Mobile Haptic Design: Piezoelectric Actuator Technology Properties in Hand Held Devices, HAVE2006—IEEE International Workshop on Haptic Audio VisualEnvironments and their Application, IEEE, PI, Jan. 1, 2006, pp. 40-43 XP031041929, ISBN: 978-1-42244-0760-6.
Koskinen et al., Feel-Good Touch: Finding the Most Pleasant Tactile Feedback for a Mobile Touch Screen Button, 10th International Conference on Multimodal Interfaces. ICMI '08—Oct. 20-22, 2008—Chania, Crete, Greece, Jan. 1, 2008 pp. 297-304, XP009138987, ISBN: 978-1-60560-511-1.
Poupyrev et al., Tactile Interfaces for Small Touch Screens, Proceedings of the 16th Annual ACM Symposium on User Interface Software and Technology, Vancouver, Canada, Nov. 2, 2003 [ACM Symposium on User Interface Software and Technology] ACM Press, New York, NY vol. 5, No. 2, Jan. 3, 2003 pp. 217-220, XP002516572, DOI: 10.1145/964696.964721 ISBN: 978-158113-636-4.
Mackenzie et al., The Tactile Touchpad, CHI 97 Extended Abstracts on Human Factors in Computing Systems Looking to the Future, Jan. 1, 1997 DOI: 10.1145/1120212.1120408, ISBN: 978-0-89-791926-5, pp. 309-310.
Extended European Search Report mailed Apr. 20, 2012 in 09/34407.0-2224 / 2369448 PCT/JP2009007079.
Extended European Search Report mailed Apr. 20, 2012 in 11170994.5-2224 / 2372497.
Extended European Search Report mailed May 18, 2012 in 09834408.8-1527 /2369449 PCT/JP2009007080.
JPO, Office Action, mailed Jan. 17, 2012 in JP 2008-326281.
U.S. Appl. No. 12/979,223, Apr. 12, 2012, Office Action.
U.S. Appl. No. 13/001,591, May 21, 2012, Office Action.
U.S. Appl. No. 13/001,570, Mar. 6, 2012, Final Office Action.
U.S. Appl. No. 13/001,595, Mar. 13, 2012, Final Office Action.
CN Office Action mailed Nov. 2, 2012 in CN 2010800339237.
JPO Office Action mailed Nov. 27, 2012 in JP 2010-288790.
U.S. Appl. No. 13/001,591, Dec. 6, 2012, Final Office Action.
U.S. Appl. No. 13/001,595, Dec. 4, 2012, Final Office Action.
EPO Office Action dated Feb. 11, 2013 in EP 11 170 994.5.
EPO Office Action dated Feb. 12, 2013 in EP 09 834 407.0.
CN Office Action dated Dec. 21, 2012 in CN 201080033924.1.
U.S. Appl. No. 13/001,570, filed May 7, 2013, Office Action.
CN Office Action dated Apr. 24, 2013 in CN 201080033923.7.
CN Office Action dated May 6, 2013 in CN 200980151954.X.
Domes incollables Switch' Air™, Nicomatic, Mar. 2006, 3 pgs.
JPO, Office Action mailed Jan. 29, 2013 in JP 2010-288796.
EPO Office Action mailed Feb. 5, 2013 in EP 09 834 408.8.
CN Office Action dated Jun. 18, 2013 in CN 200980151955.4.
U.S. Appl. No. 13/001,570, Sep. 5, 2013, Final Office Action.
CN Office Action dated Oct. 17, 2013 in CN 201080033924.1.
U.S. Appl. No. 13/001,570, Jan. 9, 2014, Notice of Allowance.
CN Office Action dated Oct. 12, 2013 in CN 201080033923.7.
KIPO Office Action mailed Sep. 27, 2013 in KR 2011-7014258.
EPO Office Action dated Sep. 3, 2013 in EP 09 834 408.8.
U.S. Appl. No. 13/001,591, Sep. 17, 2013.
U.S. Appl. No. 13/001,595, Sep. 17, 2013.
CN Office Action dated Jan. 3, 2014 in CN 200980151954.X.
KIPO Office Action dated Jan. 3, 2014 in KR 2013-7028707.
U.S. Appl. No. 13/001,591, Feb. 3, 2014, Final Office Action.
U.S. Appl. No. 13/001,595, Feb. 5, 2014, Final Office Action.
CN Office Action dated Feb. 17, 2014 in CN 200980151955.4.
EPO Office Action dated Feb. 17, 2014 in EP 10 804 122.9.
EPO Office Action dated Nov. 6, 2013 in EP 09 834 407.0.
EPO Office Action dated Nov. 6, 2013 in EP 11 170 994.5.
U.S. Appl. No. 13/001,570, May 12, 2014, Notice of Allowance.
CN Office Action dated May 30, 2014 in CN 201080033923.7 with concise explanation.

* cited by examiner

FIG. 6
(a)
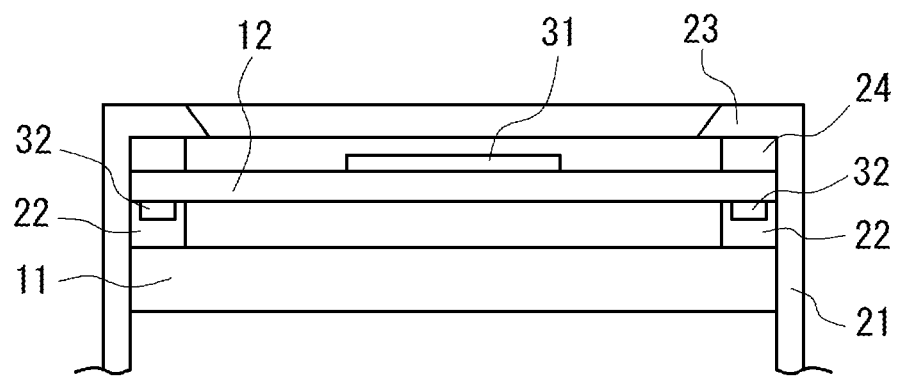
(b)
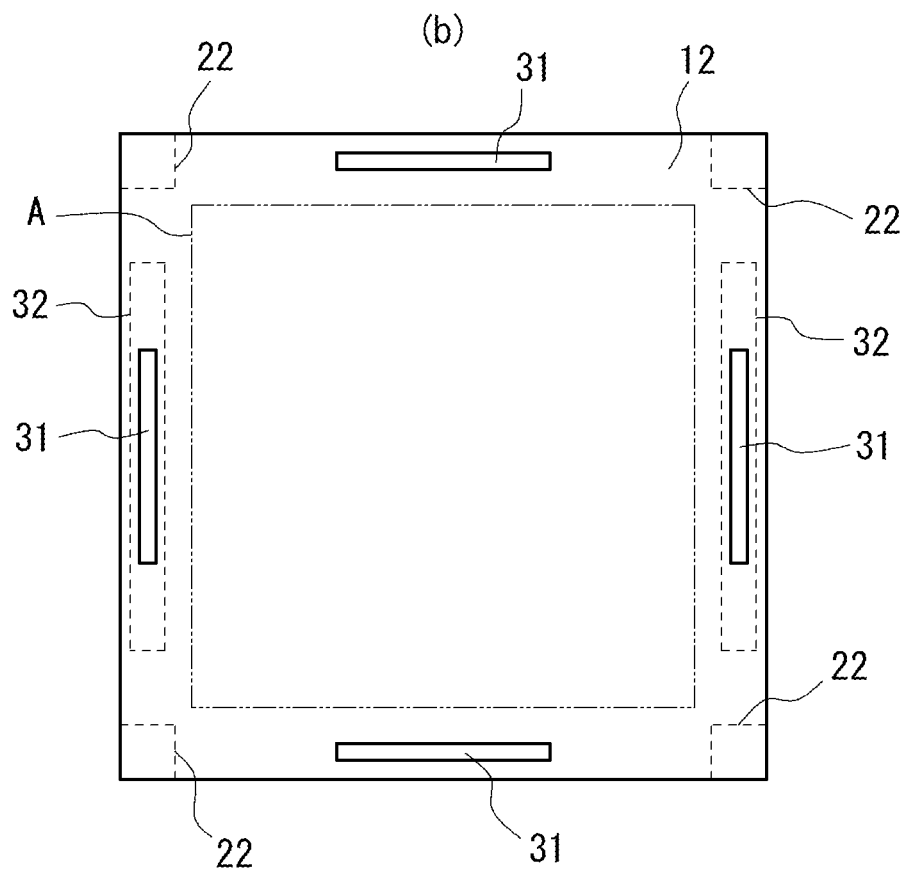

INPUT APPARATUS

CROSS REFERENCE TO RELATED APPLICATIONS

This application claims priority to and the benefit of Japanese Patent Applications No. 2008-326281, No. 2008-326316 and No. 2008-326311 filed on Dec. 22, 2008, the entire contents of which are incorporated herein by reference.

TECHNICAL FIELD

The present invention relates to input apparatuses having input units for receiving pressure inputs.

BACKGROUND ART

In recent years, input apparatuses having input units in the form of a plate for receiving inputs by pressure such as touch panels, touch switches and the like are popularly used as input units for receiving input operations by the user in information equipments, home electric appliances and the like. Such input units have a variety of types, such as resistive film type, capacitive type and the like. All of these input units are for receiving pressure inputs by fingers and stylus pens and, unlike push-button switches, they are not displaced even when being pressed.

Therefore, an operator cannot obtain feedback when the pressure input is received by the input unit. As a result, when using the input apparatus having the touch panel, for example, the operator is likely to input erroneously by tapping multiple times on the same spot, which may be stressful for the operator.

As methods to prevent such erroneous inputs, there are known methods for visually or auditory confirming the input operations by, for example, generating sounds or by changing a display state, such as colors of input objects such as input buttons and the like graphically displayed on a display unit, correspondingly to a pressured area upon reception of the pressure inputs.

However, such auditory feedback may be difficult to be confirmed in a noisy environment and is not applicable when the equipment being used is in a silent mode. In addition, in using such visual feedback, if the input object displayed on the display unit is small, the operator may not be able to confirm the change in the display state, and particularly when the operator is inputting by a finger, a view of the input object is blocked by the finger.

There is also suggested a feedback method relying on neither the auditory nor visual sensation but instead generating a tactile sensation at operator's fingertip by vibrating the touch panel upon reception of an input thereon (for example, see Patent Documents 1, 2).

RELATED ART DOCUMENTS

Patent Documents

Patent Document 1: Japanese Patent Laid-Open No. 2003-288158
Patent Document 2: Japanese Patent Laid-Open No. 2008-130055

SUMMARY OF INVENTION

Technical Problem

The techniques disclosed in the above Patent Documents 1 and 2, however, merely generate the tactile sensation at the operator's fingertip. That is, they provide a mere "throbbing" sensation at the operator's fingertip touching the touch panel and not a realistic click sensation such as "click" which is obtained when operating, for example, a push-button switch with a metal dome.

Therefore, the operator may have a feeling of strangeness if the above feedback techniques are applied to the touch panels of, for example, input keys of the information equipments such as mobile terminals of mobile phones, calculators, ticket vending machines and the like and input keys of operation units of the home electric appliances such as microwaves, TV sets and the like.

Accordingly, an object of the present invention in consideration of such conditions is to provide an input apparatus capable of providing the realistic click sensation, similar to that obtained when the push-button switch is operated, when an operator operates the input unit of a pressure type.

Solution to Problem

In order to achieve the above object, an input apparatus according to a first aspect of the present invention includes:
an input unit for receiving a pressure input;
a load detection unit for detecting a pressure load on the input unit;
a vibration unit for vibrating the input unit; and
a control unit for controlling drive of the vibration unit such that a click sensation is provided to an object pressing the input unit, when the pressure load detected by the load detection unit satisfies a predetermined standard for receiving an input to the input unit.

In addition, in order to achieve the above object, an input apparatus according to a second aspect of the present invention includes:
an input unit for receiving a pressure input;
a load detection unit for detecting a pressure load on the input unit;
a vibration unit for vibrating the input unit; and
a control unit for controlling drive of the vibration unit to vibrate the input unit at a frequency such that a click sensation is provided to an object pressing the input unit, when the pressure load detected by the load detection unit satisfies a predetermined standard for receiving an input to the input unit.

Moreover, in order to achieve the above object, an input apparatus according to a third aspect of the present invention includes:
an input unit for receiving a pressure input;
a load detection unit for detecting a pressure load on the input unit;
a vibration unit for vibrating the input unit; and
a control unit for controlling drive of the vibration unit such that a click sensation is provided to an object pressing the input unit, when the pressure load detected by the load detection unit satisfies a predetermined standard for receiving an input to the input unit, and for controlling drive of the vibration unit such that the click sensation is provided to the object, when the pressure load detected by the load detection unit satisfies a predetermined standard after the input to the input unit is received.

Effect of the Invention

According to the first aspect of the present invention, the input unit vibrates if the pressure load on the input unit satisfies a predetermined standard for receiving an input.

Thereby, it is possible to provide the operator with a realistic click sensation similar to that obtained when a push-button switch is operated.

According to the second aspect of the present invention, the input unit vibrates at a frequency if the pressure load on the input unit satisfies a predetermined standard for receiving an input. Thereby, it is possible to provide the operator with the realistic click sensation similar to that obtained when the push-button switch is operated.

According to the third aspect of the present invention, the input unit vibrates if the pressure load on the input unit satisfies a predetermined standard for receiving an input and then the input unit vibrates if the pressure load on the input unit satisfies a predetermined standard. Thereby, it is possible to provide the operator with the realistic click sensation similar to that obtained when the push-button switch is operated.

BRIEF DESCRIPTION OF DRAWINGS

FIG. 6 shows an exemplary housing structure of the input apparatus shown in FIG. 5;

DESCRIPTION OF EMBODIMENTS

Prior to descriptions of embodiments of the present invention, a description of a principle of a method to provide a click sensation by an input apparatus according to the present invention is presented.

For tactile sensory awareness, a human has a nerve responsible for a pressure sensation to feel a tactile sensation such as hardness or softness of an object from a load introduced to a bone and a muscle when touching the object, and another nerve responsible for a tactile sensation to feel a texture of the object and the like by detecting a vibration introduced to a skin surface when touching the object. That is, the pressure sensation detects the load, whereas the tactile sensation detects the vibration. In addition, a tactile sensation is generally a combination of the pressure sensation and the tactile sensation. Accordingly, reproduction of a stimulus, similar to the stimulus to the "pressure sensation" and the "tactile sensation" when operating a push-button switch, on a touch panel enables to provide a click sensation to an operator.

On the other hand, metal dome switches, emboss switches, rubber switches, tactile switches and the like, for example, are widely known as the push-button switches used for information equipments and home electric appliances. Although there are differences in the stroke of a push-button and the applied load (pressing force) according to types of the switches, those general push-button switches basically have load characteristics as shown in FIG. 1.

Figure 1:
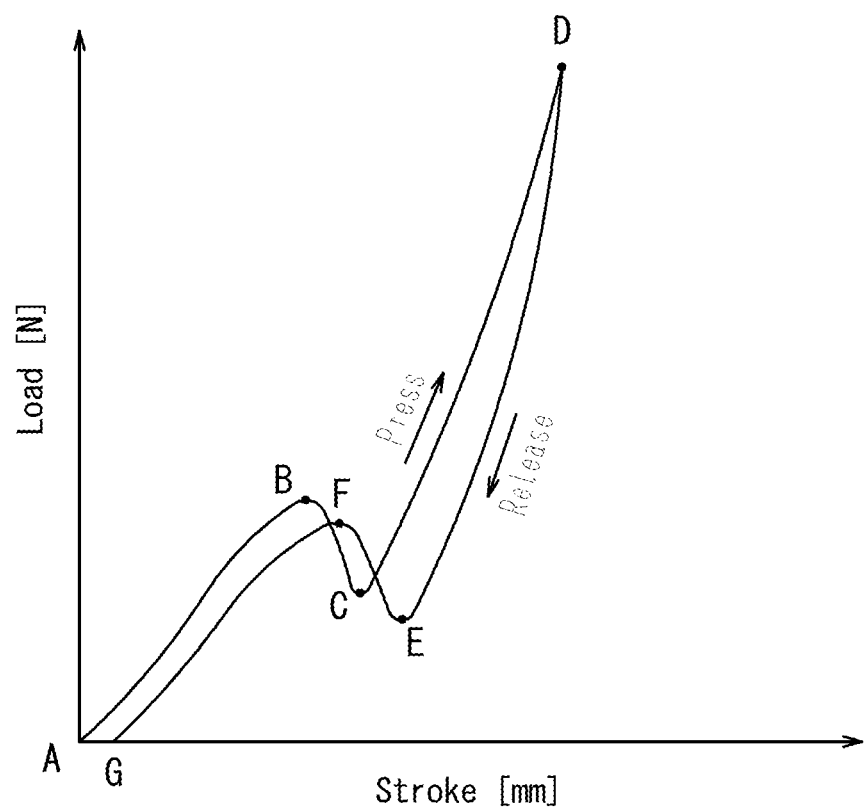
FIG. 1 is a diagram illustrating a general load characteristic of a push-button switch.

In the load characteristics in pressing in FIG. 1, a period from a point A to a point B represents a period in which a load increases in substantially proportion to pressing down from a start of pressing the push button. A period from the point B to a point C represents a period in which a convex elastic member such as the metal dome is buckled since the push button is pressed down, and thus the load is rapidly decreased. A period from the point C to a point D represents a period in which a contact point of the switch is closed and the load increases in substantially proportion to pressing down.

Although there is a hysteresis to some degrees, the load characteristics of the push button in releasing retrace a change of the load in pressing. That is, a period from the point D to a point E represents a period in which the load decreases in substantially promotion to release from a start thereof and the contact point of the switch maintains a closed state. A period from the point E to a point F represents a period in which the elastic member recovers in a convex form from a buckled form by release of the push button and the load increases rapidly, and at start of this period the contact point of the switch is open. A period from the point F to a point G represents a period in which a finger is released from the push button after recovery of the elastic member and the load decreases in substantially proportion to the release.

In the load characteristics shown in FIG. 1, a maximum stroke of the push button is minimal; equal to or less than 1 mm for the metal dome switch, the emboss switch and the tactile switch and equal to or less than 3 mm for the rubber switch, for example. In addition, loads at the point B are around 1 N to 6 N, for example, on the metal dome switch, the emboss switch and the tactile switch and around 0.5 N, for example, on the rubber switch. The operator can feel the click sensation when operating any of those push-button switches.

As such, inventors of the present invention studied what kind of movement of the push-button switch provides the click sensation created by the "pressure sensation" and the "tactile sensation". First, it is studied which causes the click sensation, change in the stroke or change in the pressure load.

Figure 2:
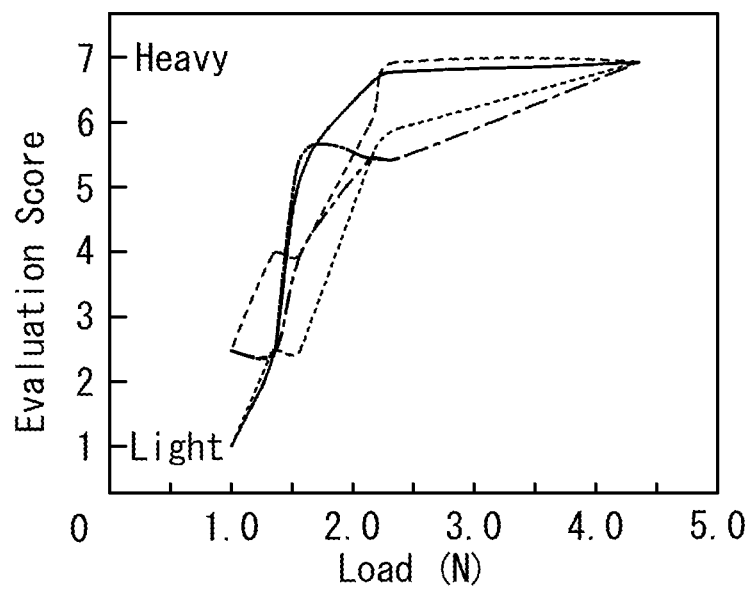
FIG. 2 is a diagram illustrating results of sensory evaluations on operations of a variety of push-button switches with different pressure loads.

FIG. 2 is a diagram illustrating results of sensory evaluations on how the operator felt when operating a variety of push-button switches with different pressure loads. A horizontal axis represents an actual pressure load and a vertical axis represents how operators felt about the push-button switches, heavy or light, on a scale of 1 to 7. Subjects as the operators were five people who were accustomed to use of mobile terminals. As can be seen in FIG. 2, it is shown that they could percept that push-button switches with high pressure loads were heavy and others with low pressure loads were light.

Figure 3:
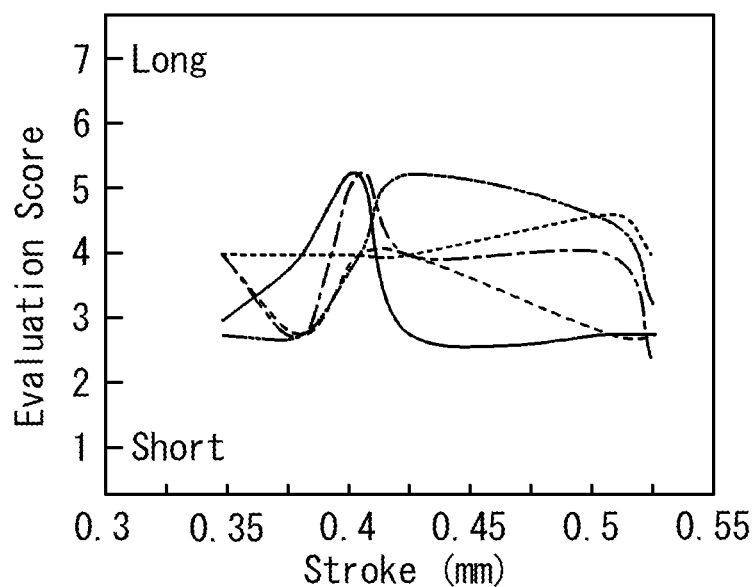
FIG. 3 is a diagram illustrating results of sensory evaluations on operations of a variety of push-button switches with different strokes.

FIG. 3 is a diagram illustrating results of sensory evaluations on how the operators felt when operating a variety of push-button switches with different strokes. A horizontal axis represents actual strokes and a vertical axis represents how the operators felt about the push-button switches, long or short, on a scale of 1 to 7. Subjects as the operators were five people, the same as those in FIG. 2, who were accustomed to use of mobile terminals. As can be seen in FIG. 3, they could not clearly percept whether a minimal stroke was long or short.

The results of sensory evaluations presented above shows that the human can percept a difference in the load but not a difference in the minimal stroke.

Therefore, the inventors focused on a change in the pressure load. That is, since the human cannot percept the difference in the stroke, it was studied whether the human can feel the click sensation if the pressure load on a plane such as a touch panel, that is, a stimulus to the pressure sensation is changed following the points A, B and C in FIG. 1. Therefore, an experimental apparatus having a plate displaceable in a vertical direction was prepared. Then, the plate was pressed down from the point A to the point B as shown in FIG. 1, and at a point when a load reached the load at the point B the plate was instantaneously displaced downward slightly in order to reproduce the change in the load between the points B, C.

As a result, although a "sense of pressing" to "have pressed down" the push-button switch was obtained, the realistic click sensation such as "click" which could be obtained when operating the metal dome switch, for example, was not obtained. That is, it was found out that there is another element, which cannot be cleared by a relationship between the stroke and the load, in order to obtain the realistic click sensation.

As such, the inventors next studied focusing not only on the "pressure sensation" but also the "tactile sensation", which is another sensibility. Accordingly, with a variety of mobile terminals having the input apparatus with the push-button switches of the metal dome switches mounted thereon, the inventors measured vibrations generated at push buttons when the push buttons were operated. As a result, it was found out that at a point when the pressure load reached the point B in FIG. 1, that is, at a point when the metal dome started being buckled, the push button vibrated at a frequency of approximately 100-200 Hz.

Figure 4:
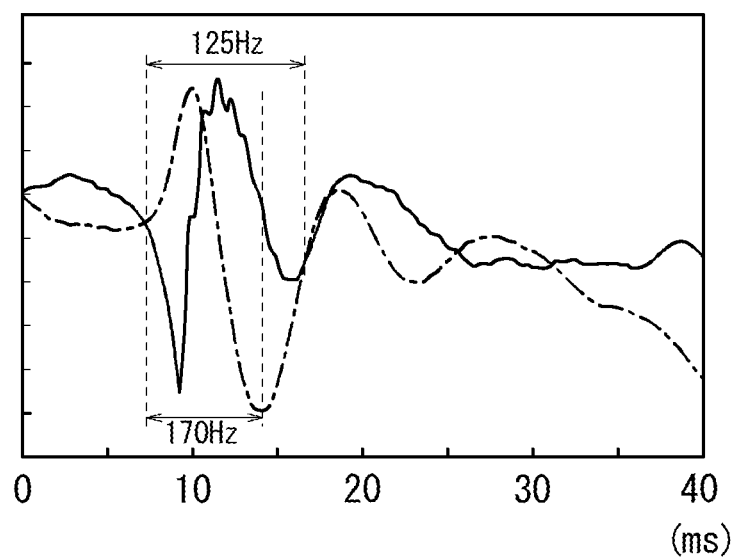
FIG. 4 is a diagram illustrating an exemplary result of a measurement of a vibration generated at a push button upon operation of the push-button switch.

FIG. 4 is a diagram illustrating an exemplary result of such measurement. A horizontal axis represents a pressure elapsed time, whereas a vertical axis represents vibration amplitude. This push-button switch vibrates as shown by a solid line in FIG. 4 at the point B in FIG. 1. Thereby, it was found out that the human receives 1 period of vibration stimulus of about 6 ms (a frequency of approximately 170 Hz) when pressing this push-button switch. In addition, at a point when the pressure load on the push-button switch reached the point F in FIG. 1 in releasing, that is, at a point when the metal dome recovered from the buckled state, this push button vibrated as shown by the dashed line in FIG. 4. Thereby, it was found out that in case of this push-button switch the human receives 1 period of the vibration stimulus of about 8 ms (a frequency of approximately 125 Hz) at release.

The above results show that it is possible to provide the operator with the click sensation similar to that obtained when operating the push-button switch having the result of measurement as shown in FIG. 4, when the operator presses down the input unit of a pressure type in the form of a plate such as the touch panel, if the input apparatus stimulates the pressure sensation by letting the operator voluntarily press down the input unit without vibration when the load is from the point A to the point B shown in FIG. 1 and, at the point B, stimulates the tactile sensation by vibrating the input unit for 1 period at the frequency of 170 Hz.

Based on the above principle, when the input unit of the pressure type in the form of the plate is pressed down, the input apparatus according to the present invention stimulates the pressure sensation until the pressure load satisfies a predetermined standard for receiving an input to the input unit and, when the standard is satisfied, stimulates the tactile sensation by vibrating the input unit with a predetermined drive signal, that is, with a frequency, period which means drive time (wavelength), waveform and vibration amplitude. Thereby, the input apparatus provides the operator with the realistic click sensation similar to that obtained upon pressing down the push-button switch.

In addition, when operating the push-button switch, the human receives a tactile stimulus as shown in FIG. 4 at a finger from the push-button switch not only in pressing but also in releasing. As such, the input apparatus according to the present invention provides the operator with the click sensation in releasing as well (hereinafter, the click sensation in releasing is also referred to as a release tactile sensation, arbitrarily). Thereby, the input apparatus provides the operator with a more realistic click sensation similar to that obtained upon pressing the push-button switch down.

Embodiments of the present invention will be described with reference to the accompanying drawings.

(First Embodiment)

Figure 5:
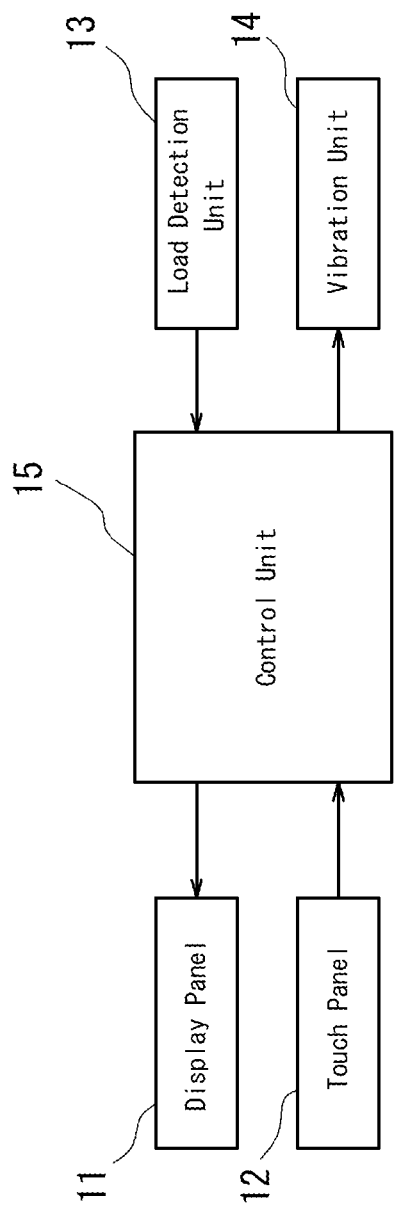
FIG. 5 is a block diagram illustrating a schematic constitution of an input apparatus according to a first embodiment of the present invention.

FIG. 5 is a block diagram illustrating a schematic constitution of an input apparatus according to a first embodiment of the present invention. This input apparatus has a display panel 11, a touch panel 12, a load detection unit 13, a vibration unit 14, and a control unit 15 for controlling overall operations. The display panel 11 constitutes a display unit for displaying input objects such as an input button and the like and may be, for example, a liquid crystal display panel, an organic EL display panel or the like. The touch panel 12 constitutes the input unit for receiving a pressure input to the display panel 11 and may be of a known type such as, for example, a resistive film type, a capacitive type or the like. The load detection unit 13 detects a pressure load on the touch panel 12 and may include, for example, a strain gauge sensor. The vibration unit 14 vibrates the touch panel 12 and may include, for example, a piezoelectric vibrator.

FIG. 6 shows an example of housing structure of the input apparatus shown in FIG. 5; FIG. 6(*a*) is a cross-sectional view of a main section, and FIG. 6(*b*) is a plane view of the main section. The display panel 11 is contained in a housing 21. A touch panel 12 is disposed on the display panel 11 via insulators 22 made of elastic members. In the input apparatus according to the present embodiment, the display panel 11 and the touch panel 12 are rectangular in shape in a planer view and the touch panel 12 is disposed on the display panel 11 via the insulators 22, which are arranged outside a display area A of the display panel 11 shown by a chain double-dashed line in FIG. 6(*b*).

In addition, the housing 21 is provided with an upper cover 23 covering a surface area of the touch panel 12 outside the display area of the display panel 11. Insulators 24 made of elastic members are arranged between the upper cover 23 and the touch panel 12.

The touch panel 12 may have a surface, that is, an operation plane constituted by a transparent film and a rear face constituted by a glass plate and may be designed such that the transparent film of the surface is bent (strained) slightly in accordance with the pressure when the operation plane is pressed.

A strain gauge sensor 31 for detecting a load (pressuring force) applied on the touch panel 20 is provided, adhered or the like, on the transparent film of the surface of the touch panel 12 at a position close to each side covered by the upper cover 23. In addition, a piezoelectric vibrator 32 for vibrating the touch panel 12 is provided, adhered or the like, on the glass plate of the rear face of the touch panel 12 close to an edge of each of two opposed sides. That is, the input apparatus shown in FIG. 6 has the load detection unit 13 in FIG. 5 including four strain gauge sensors 31 and the vibration unit 14 including two piezoelectric vibrators 32. It is to be noted that the housing 21, the upper cover 23 and the insulator 24 shown in FIG. 6(*a*) are omitted in FIG. 6(*b*).

Figure 7:
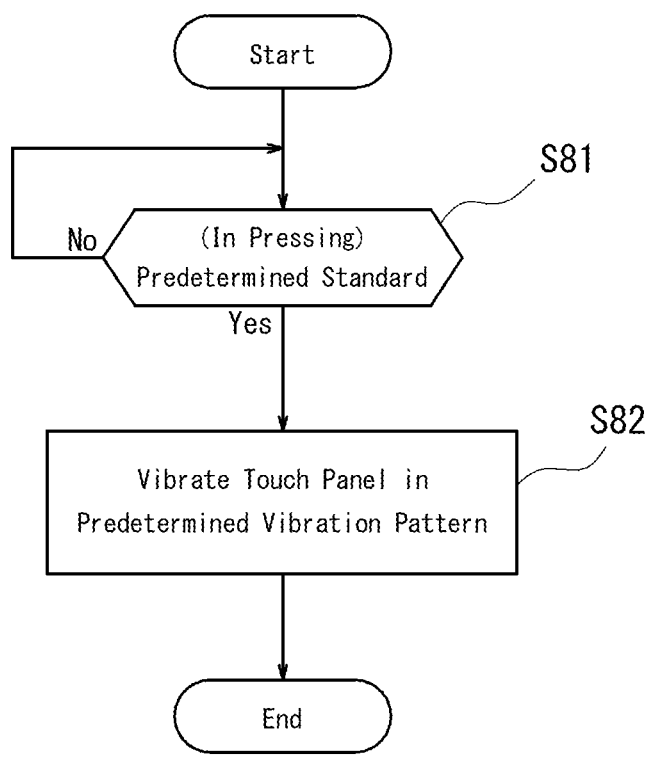
FIG. 7 is a flowchart of operations by the input apparatus shown in FIG. 5.

FIG. 7 is a flowchart of operations by the input apparatus according to the present invention. The control unit 15 monitors an input to the touch panel 12 as well as a load detected by the load detection unit 13. The control unit 15 detects that the input to the touch panel 12 is an input to the input object displayed on the display panel 11, and that the pressure load detected by the load detection unit 13 increases with pressure on the touch panel 12 and reaches a predetermined standard for receiving the input (step S81). Upon detecting that, the control unit 15 receives the input to the touch panel 12 at a point of detection and drives the vibration unit 14 with a predetermined drive signal to vibrate the touch panel 12 in a predetermined vibration pattern (step S82). Thereby, the click sensation is provided to the operator via a finger or an object such as a stylus pen which is pressing the touch panel 12, such that the operator recognizes that an input operation is completed. The load detection unit 13 detects the load from, for example, an average output value of the four strain gauge sensors 31. In addition, the vibration unit 14 drives, for example, two piezoelectric vibrators 32 in phase.

Here, the predetermined standard used for detection at step S81 is, for example, the load at the point B shown in FIG. 1. Accordingly, this predetermined standard may be appropriately set in accordance with the load characteristics of an intended push-button switch in pressing. For the mobile terminals, for example, the predetermined standard may be set by users as desired such that elder users may set it heavier, whereas users who often write messages may set it lighter. In addition, the predetermined drive signal to drive the vibration unit 14 at step S82, that is, a frequency, period (wavelength), waveform and vibration amplitude to stimulate the tactile sensation may be set appropriately according to the click sensation to be provided. For example, in order to provide the click sensation represented by the metal dome switch used for the mobile terminals, at a point when the predetermined load is applied on the touch panel 12, the vibration unit 14 is driven by a drive signal, for example a sine wave with a constant frequency of 170 Hz, for 1 period so as to vibrate the touch panel 12 by approximately 15 μm while a predetermined load is being applied thereon, as stated below. Thereby, it is possible to provide the operator with the realistic click sensation.

As set forth above, the input apparatus according to the present embodiment stimulates the pressure sensation until the load applied to the touch panel 12 and detected by the load detection unit 13 satisfies the predetermined standard for receiving an input to the touch panel 12 and, when the predetermined standard is satisfied, stimulates the tactile sensation by driving the vibration unit 14 with the predetermined drive signal such that the touch panel 12 is vibrated in the predetermined vibration pattern. Thereby, the input apparatus provides the operator with the click sensation such that the operator recognizes that the input operation is completed. Accordingly, being able to perform the input operation with feeling the realistic click sensation similar to that obtained when operating the push-button switch, the operator may not have a feeling of strangeness. Moreover, since the operator performs the input operation in conjunction with a perception to "have tapped" the touch panel 12, it prevents erroneous inputs caused by mere tapping.

(Second Embodiment)

Figure 8:
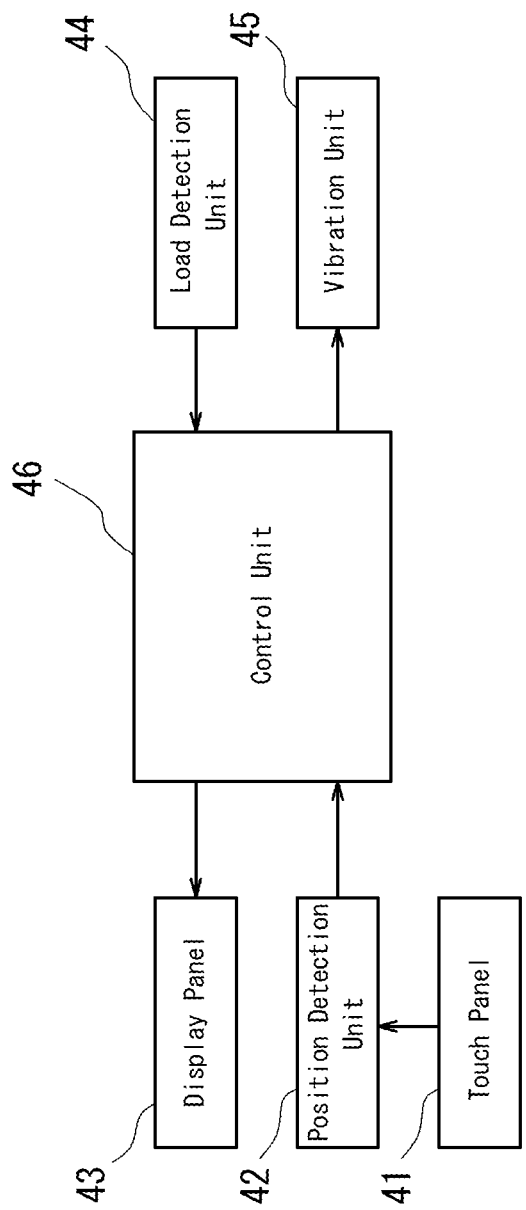
FIG. 8 is a block diagram illustrating a schematic constitution of an input apparatus according to a second embodiment of the present invention.
Figure 9:
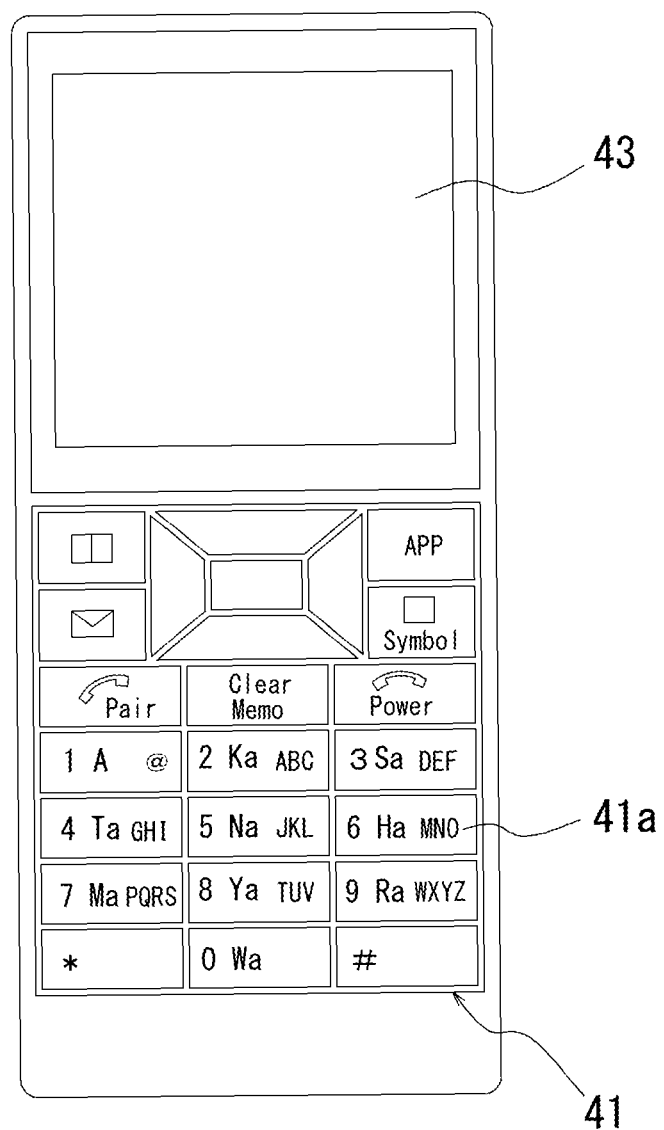
FIG. 9 is a front view of the input apparatus shown in FIG. 8.

FIG. 8 and FIG. 9 illustrate an input apparatus according to a second embodiment of the present invention; FIG. 8 is a block diagram of a schematic constitution and FIG. 9 is a front view thereof. This input apparatus is mounted on, for example, the mobile terminal and, as shown in FIG. 8, has a touch panel 41 as the input unit for receiving a pressure input, a position detection unit 42 for detecting an input position on the touch panel 41, a display panel 43 for displaying information based on the input position detected by the position detection unit 42, a load detection unit 44 for detecting a pressure load on the touch panel 41, a vibration unit 45 for vibrating the touch panel 41 and a control unit 46 for controlling overall operations.

As shown in FIG. 9, a plurality of input objects 41*a* such as numeric keys are already provided on the touch panel 41 by printing, a sticker and the like. For each input object 41*a*, in order to prevent an erroneous input to press a plurality of adjacent input objects 41*a*, an effective pressing area for receiving an input is set to be smaller than a disposition area of the input object 41*a*. It is to be noted that, in FIG. 8, the load detection unit 44 and the vibration unit 45 have strain gauge sensors and piezoelectric vibrators, respectively, in the same manner as those of the input apparatus shown in FIG. 6.

The control unit 46 monitors an input to the touch panel 41 and a load detected by the load detection unit 44, as well as monitoring an input position on the touch panel 41 detected by the position detection unit 42. When the position detection unit 42 detects an input position in the effective pressing area of the input object, and when a pressure load detected by the load detection unit 44 increases with pressure on the touch panel 41 and satisfies a predetermined standard for receiving an input, the vibration unit 45 is driven with a predetermined drive signal to vibrate the touch panel 41 in a predetermined vibration pattern.

That is, if the position detection unit 42 detects the input position in the effective pressing area of the input object, the control unit 46, in the same manner as the input apparatus according to the first embodiment, drives the vibration unit 45 with a drive signal, for example a sine wave with a constant frequency of 170 Hz, for 1 period at a point when the load on the touch panel 41 increases and satisfies the predetermined standard, in order to vibrate the touch panel 41 by approximately 15 μm while the predetermined load is being applied thereon. Thereby, the operator is provided with the click sensation so as to recognize that the input operation is completed. In addition, by receiving the input detected on the touch panel 41, the control unit 46 displays according to the input on the display panel 43.

Hence, according to the input apparatus according to the present invention, in the same manner as the first embodiment, since being able to perform the input operation on the touch panel 41 with feeling the realistic click sensation, which is the same as that obtained when operating the push-button switch, the operator does not have the feeling of strangeness. Moreover, since the operator performs the input operation in conjunction with the perception to "have tapped" the touch panel 41, it prevents erroneous inputs caused by mere tapping.

The following is description of the results of sensory evaluations on the click sensation of the input apparatus according to each of the above embodiments examined by the inventors.

According to measurements by the inventors, the metal dome switches widely used for commercially available mobile terminals, although there are deviations to some degrees according to models, have the load characteristics that the load is rapidly decreased when a predetermined load, roughly equal to or less than 6 N and generally equal to or less than 3 N, is applied thereto. As such, the inventors conducted the sensory evaluations of the click sensation of the input apparatus designed as shown in FIG. 5 and FIG. 6, with a load of 1.5 N (load at the point B in FIG. 1) on the touch panel 12 for starting drive of the vibration unit 14, and the frequency, the period (wavelength) and the waveform of the drive signal are used as parameters.

Exemplary results of the evaluations are shown in FIG. 10 to FIG. 13. In FIG. 10 to FIG. 13, the subjects were the five people involved in the sensory evaluations shown in FIG. 2 and FIG. 3. Three evaluation items were "feel click sensation", "good feeling" and tactile sensation "similar to mobile terminal". For the item "feel click sensation", "No" scores 1 and "Strongly feel" scores 7. For the item "good feeling", "Bad" scores 1 and "Good" scores 7. For the item "similar to mobile terminal", "not similar" scores 1 and "very similar" scores 7. The score of each item represents an average score of the five people.

Figure 10:
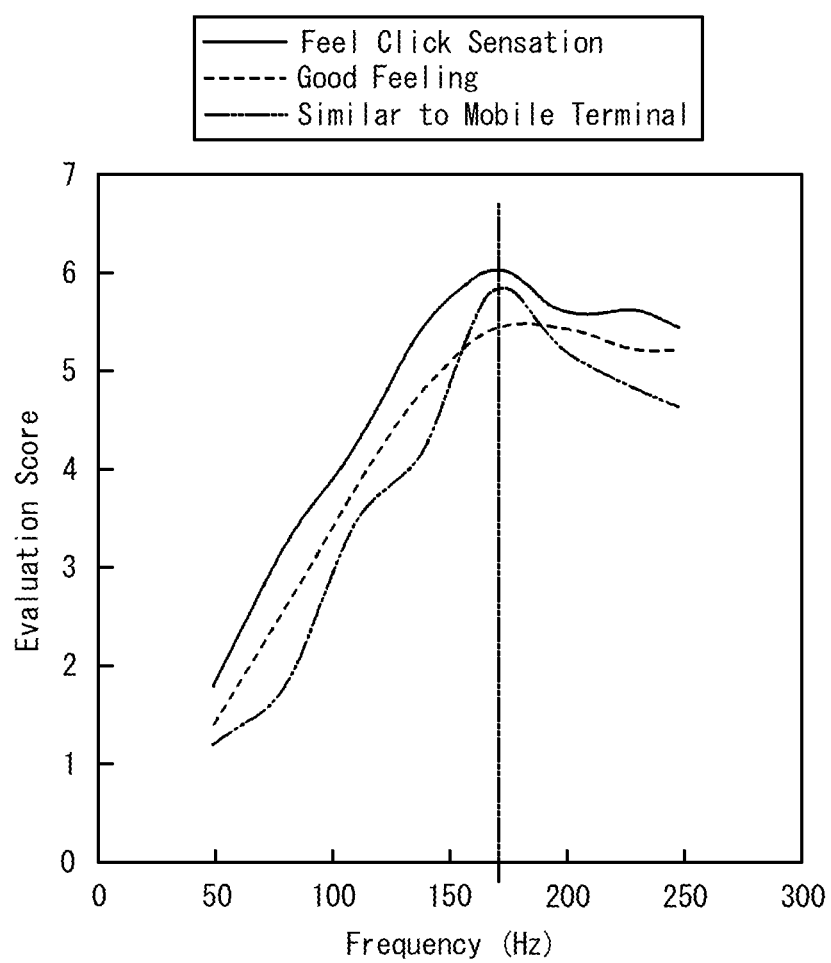
FIG. 10 is a diagram illustrating results of sensory evaluations on a click sensation when varying frequency of a drive signal to drive the vibration unit shown in FIG. 5.

FIG. 10 shows results of evaluations when varying the frequency. In the sensory evaluations, the period (wavelength) of the drive signal to drive the vibration unit 14, that is, the drive time was 1 period, the waveform was the sine wave and the frequency was varied in a range of 50-250 Hz. The amplitude of the drive signal was set to a level at which the vibration amplitude of 15 μm can be obtained in a state of a predetermined standard load being applied on the touch panel 12. As can be seen in FIG. 10, it was confirmed that, although the highest evaluation was obtained at the frequency of 170 Hz, the human can obtain the click sensation similar to that of the mobile terminals at a frequency of 140 Hz or higher.

Figure 11:
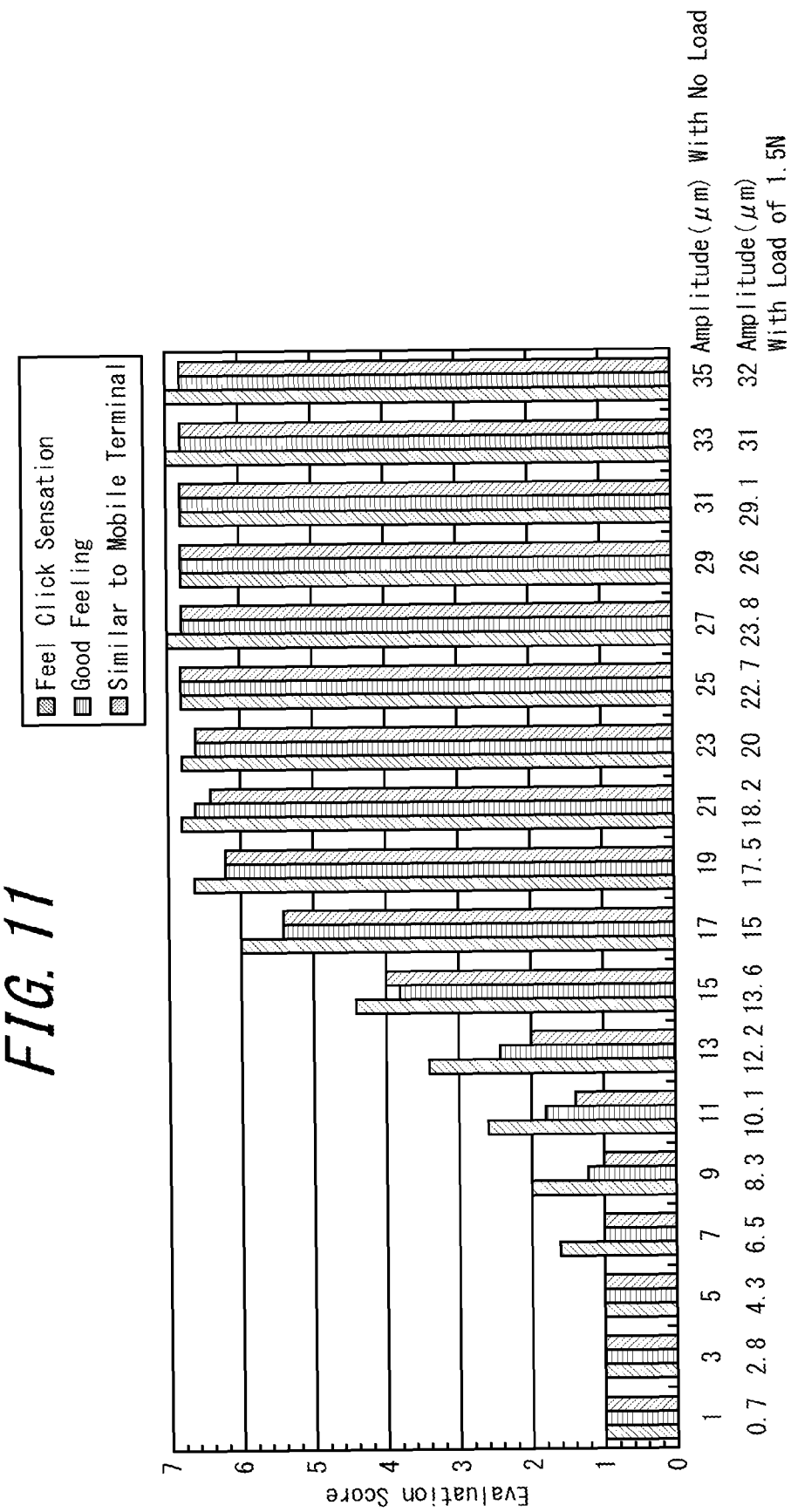
FIG. 11 is a diagram illustrating results of sensory evaluations on the click sensation when varying vibration amplitude of a touch panel shown in FIG. 5.

FIG. 11 shows results of evaluations when varying the amplitude of the drive signal. In the sensory evaluations, the frequency of the drive signal to drive the drive unit 14 was 170 Hz, the period was 1 period and the waveform was the sine wave. The signal amplitude was varied such that, in a state with no load in which the touch panel 12 was not pressed, the touch panel 12 is vibrated with predetermined amplitude in a range of 1-35 μm. Under a condition of the vibration amplitude with no load, the drive unit 14 was driven when a load of 1.5 N was applied to the touch panel 12 in order to evaluate according to each item. A horizontal axis in FIG. 11 represents the vibration amplitude when the load of 1.5 N was applied corresponding to that with no load. As a result, as can be seen in FIG. 11, it was confirmed that, in a state with the load of 1.5 N, the human can sufficiently obtain the click sensation if the vibration amplitude is 15 μm or more. That is, the human can obtain the click sensation by, in a state with the load of 1.5 N on the touch panel 12, a vibration of the touch panel 12 only 1 period at the constant frequency of 170 Hz with the vibration amplitude of 15 μm or more.

Figure 12:
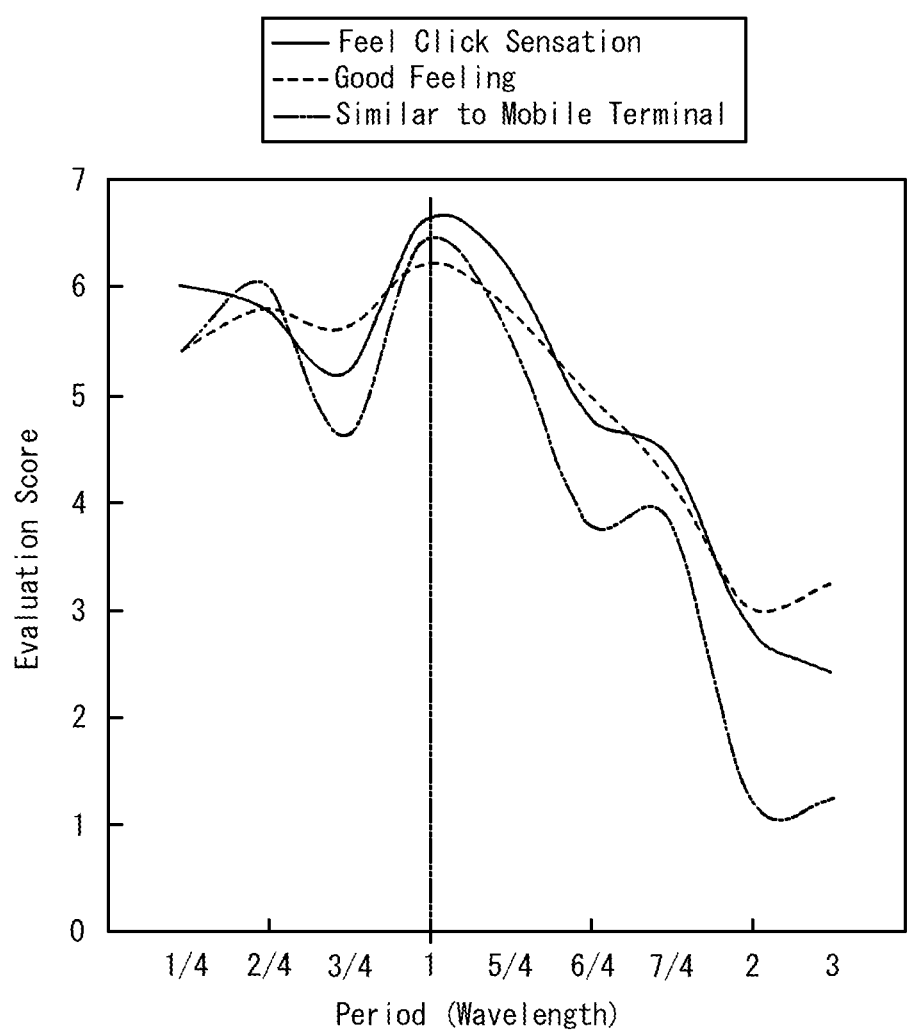
FIG. 12 is a diagram illustrating results of sensory evaluations on the click sensation when varying period of the drive signal to drive the vibration unit shown in FIG. 5.

FIG. 12 shows results of evaluations when varying the period (wavelength), that is, drive time. In the sensory evaluations, the waveform of the drive signal to drive the vibration unit 14 was the sine wave, the signal amplitude was set to a level which causes the vibration amplitude of 15 μm in a state of the predetermined standard load being applied on the touch panel 12, the frequency was 170 Hz and the period was varied in a range of ¼ to 3 periods. For ¼ period and ½ period, the signal amplitude was set such that a vibration displacement on the touch panel 12 was approximately the same as those in other periods, that is, to a level at which the vibration amplitude of approximately 15 μm is obtained. As a result, as can be seen in FIG. 12, the highest evaluation was obtained when the period (wavelength) was 1 period. In addition, it was also confirmed that, although basically good results were obtained in ¾ periods and less than 1 period, it differed from the click sensation of the mobile terminal in 3/2 or more periods.

Figure 13:
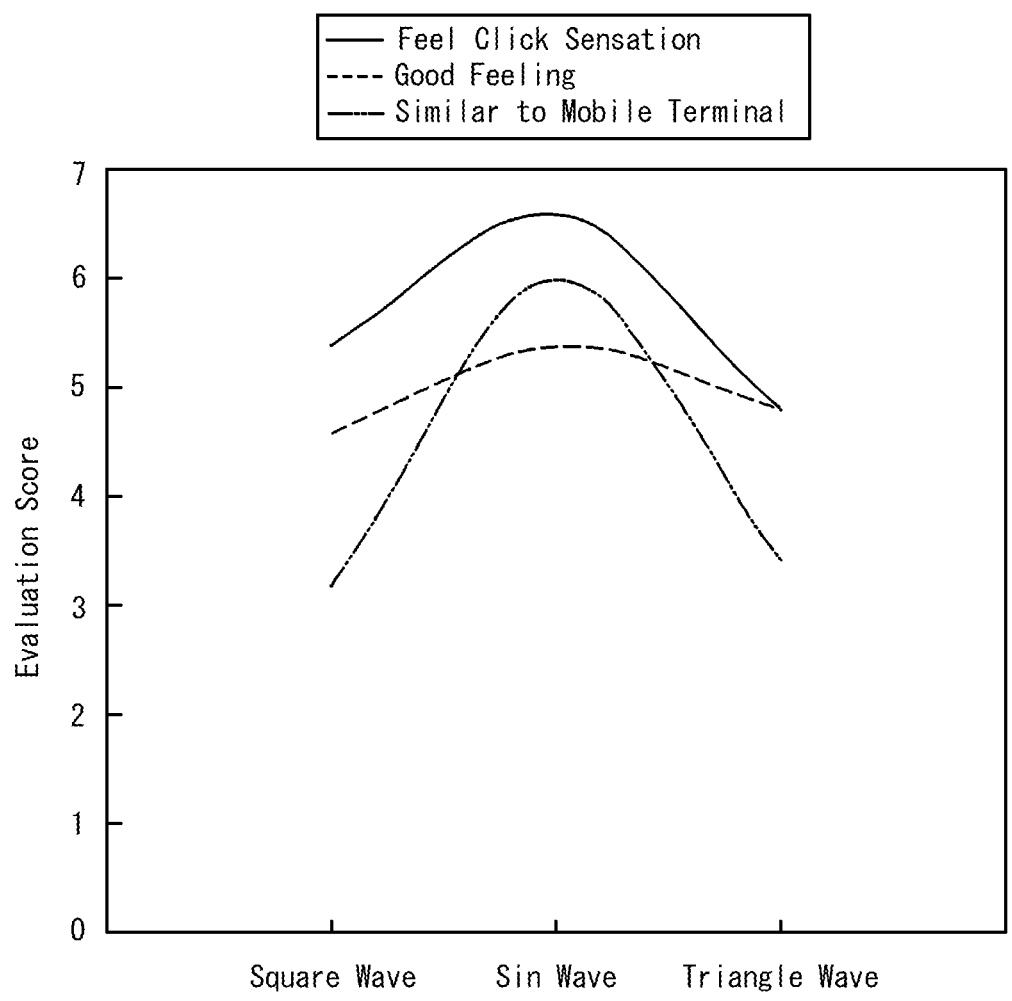
FIG. 13 is a diagram illustrating results of sensory evaluations on the click sensation when varying waveform of the drive signal to drive the vibration unit shown in FIG. 5.

FIG. 13 shows results of evaluations when varying the waveform of the drive signal. In the sensory evaluations, a sine wave, a square wave and a triangle wave were used as the waveform of the drive signal to drive the vibration unit 14. In addition, the frequency of each signal is 170 Hz, the signal amplitude was set to a level which causes the vibration amplitude of 15 μm in the state of the predetermined standard load being applied to the touch panel 12, and the period was 1 period. As a result, as can be seen in FIG. 13, the highest evaluation was obtained by the sine wave.

Figure 14:
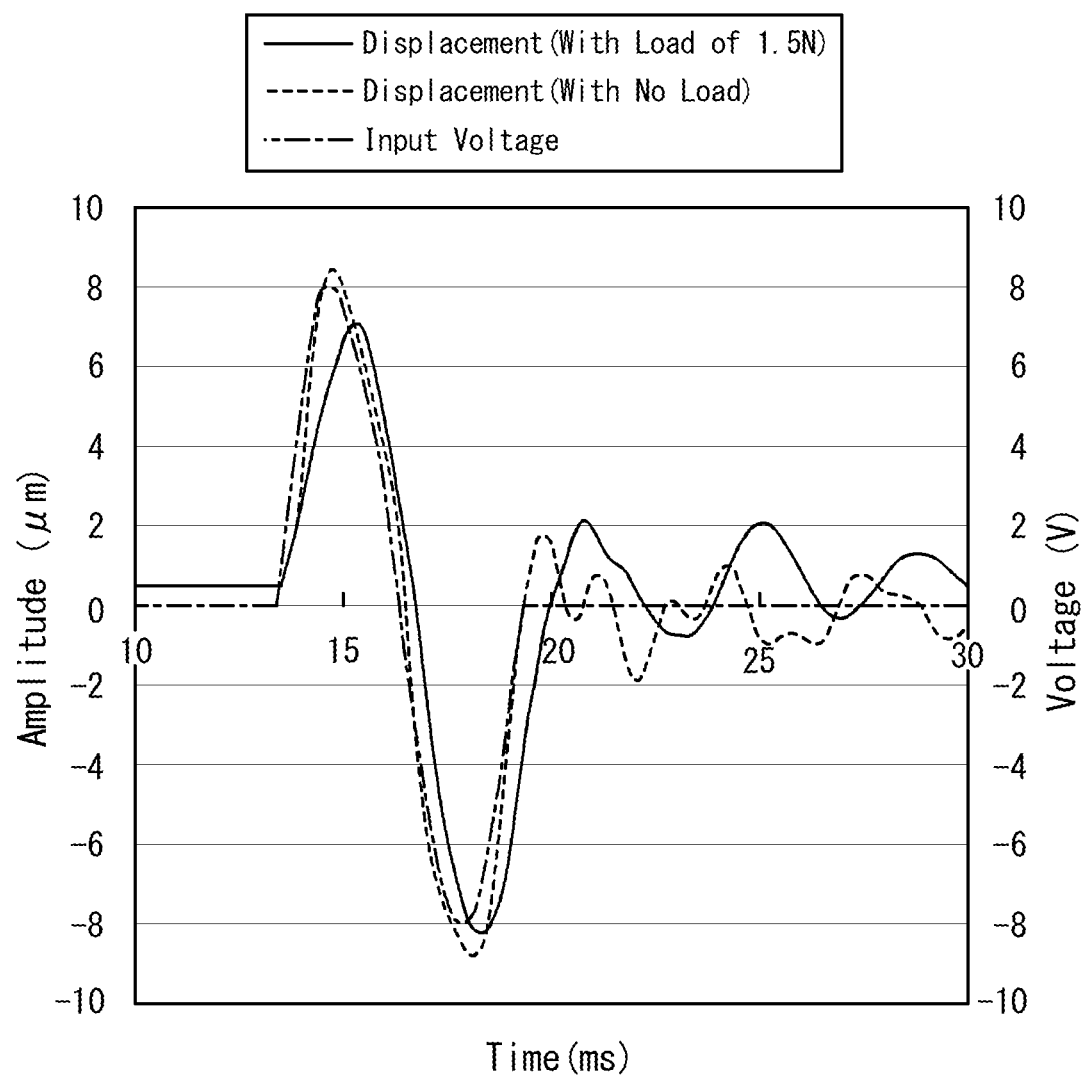
FIG. 14 is a diagram illustrating the waveform of the drive signal to drive the vibration unit and an actual waveform of the vibration amplitude on the touch panel.

Here, the drive signal of the sine wave (input voltage of the drive unit 14), as shown by a dashed line in FIG. 14, may be the voltage in 1 period from any phase not only 1 period in which the voltage increases from 0 degree phase and then decreases but also, such as, 1 period in which the voltage decreases from 180 degree phase and then increases. FIG. 14 also shows a waveform (broken line) of the vibration amplitude of the touch panel 12 under no load and a waveform (solid line) of the vibration amplitude of the touch panel 12 under a load of 1.5 N when the drive unit 14 is driven by the input voltage shown by the dashed line.

From the exemplary results of the evaluations described above, it was confirmed that, when the input apparatus designed as shown in FIG. 5 and FIG. 6 is applied to a mobile terminal, it is possible to provide the operator with the realistic click sensation by, at a point when a load satisfying the predetermined standard is applied to the touch panel 12 in pressing, vibrating the touch panel 12 by approximately 15 μm or more with the drive signal of ⅝ period or less, preferably 1 period of the sine wave with the constant frequency of 140 Hz or more, preferably 170 Hz, for example. It was also confirmed that the same results can be obtained by the input apparatus designed as shown in FIG. 8 and FIG. 9.

(Third Embodiment)

When the human operates the push-button switch, the human is given a tactile stimulus at a finger by the push-button switch not only in pressing but also in releasing, as shown in FIG. 4. As such, an input apparatus according to a third embodiment of the present invention, using the input apparatus according to the first and the second embodiments, provides the operator with the click sensation in releasing as well (hereinafter, the click sensation in releasing is referred to as the release tactile sensation, arbitrarily). Thereby, it provides the operator with a more realistic click sensation. The following is a description of operations by the input apparatus according to the present embodiment, using the constitution shown in FIG. 5 and FIG. 6 as an example.

Figure 15:
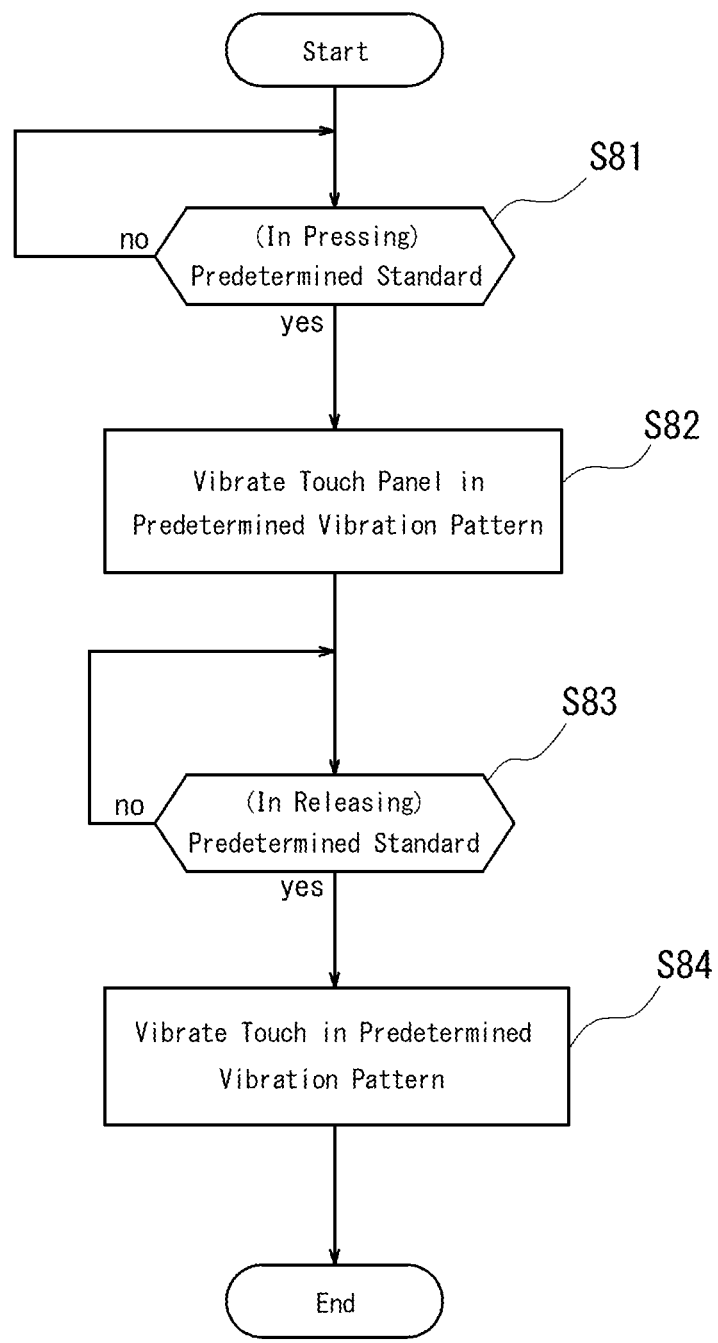
FIG. 15 is a flowchart of operations by an input apparatus according to a third embodiment of the present invention.

FIG. 15 shows a flowchart of operations by the input apparatus according to the present embodiment. As described with reference to FIG. 7, first, the control unit 15 detects that the input to the touch panel 12 is the input to the input object displayed on the display panel 11, and that the pressure load detected by the load detection unit 13 increases by pressure on the touch panel 12 and reaches a predetermined standard for receiving the input (step S81). Then, the control unit 15 receives the input to the touch panel 12 at a point of such detection, as well as driving the vibration unit 14 with a predetermined drive signal to vibrate the touch panel 12 in a predetermined vibration pattern (step S82).

Then, when detecting that the load detected by the load detection unit 13 satisfies the predetermined standard (step S83), the control unit 15 drives the vibration unit 14 with the predetermined drive signal in the same manner as in pressing, in order to vibrate the touch panel 12 in a predetermined vibration pattern (step S84).

Here, the predetermined standard load in releasing at step S83, that is, detected after a pressure input is received, may be set to any load equal to or less than the predetermined standard load in pressing detected at the step S81. In addition, the drive signal to drive the vibration unit 14 in releasing at step S84 may be either the same as or different from that in pressing at step S82. For example, the frequency of the drive signal in pressing at which an input to the touch panel 12 is received may be set to 170 Hz, and the frequency of drive signal in releasing may be set to 125 Hz as shown in FIG. 4, for example.

As stated above, it is possible to provide the release tactile sensation by, when the predetermined standard load is satisfied in releasing after the pressure input is received, driving the vibration unit 14 with the predetermined drive signal and vibrating the touch panel 12 in the predetermined vibration pattern in the same manner as that in pressing. Accordingly, in combination with the click sensation in pressing, it is possible to provide the operator with the click sensation more similar to that of the push-button switch.

Figure 16:
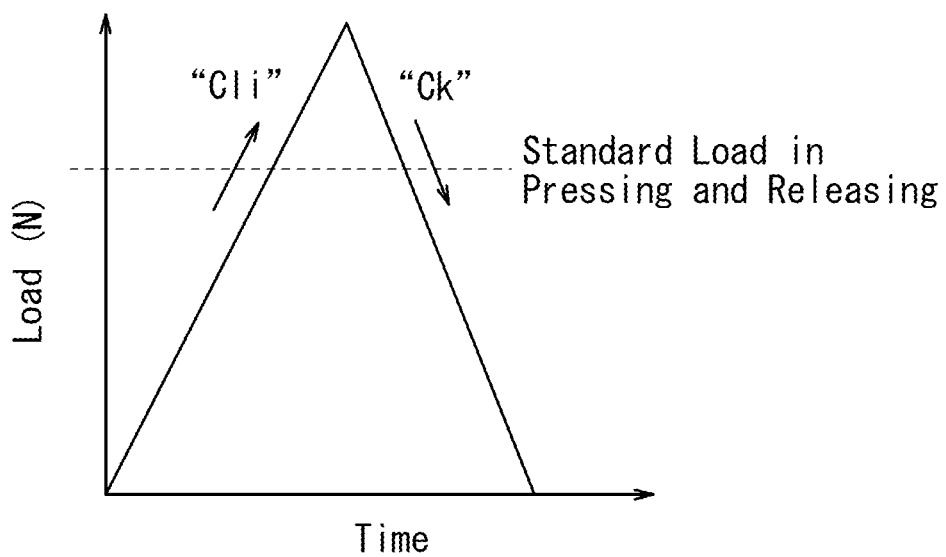
FIG. 16 is a diagram illustrating an example of click sensation provided by the input apparatus according to the third embodiment when a standard load of pressing and that of releasing are set to be equal.

For example, in a case where the standard load of pressing to drive the vibration unit 14 and that of releasing are set to be equal, it is possible to provide the click sensation in pressing and in releasing as shown in FIG. 16 if a maximum load in pressing exceeds the standard load. Accordingly, it is possible to provide the operator with the click sensation more similar to that of the push-button switch. It is to be noted that, in FIG. 16 and other figures, "Cli" and "Ck" represent the click sensation the human feels.

Figure 17:
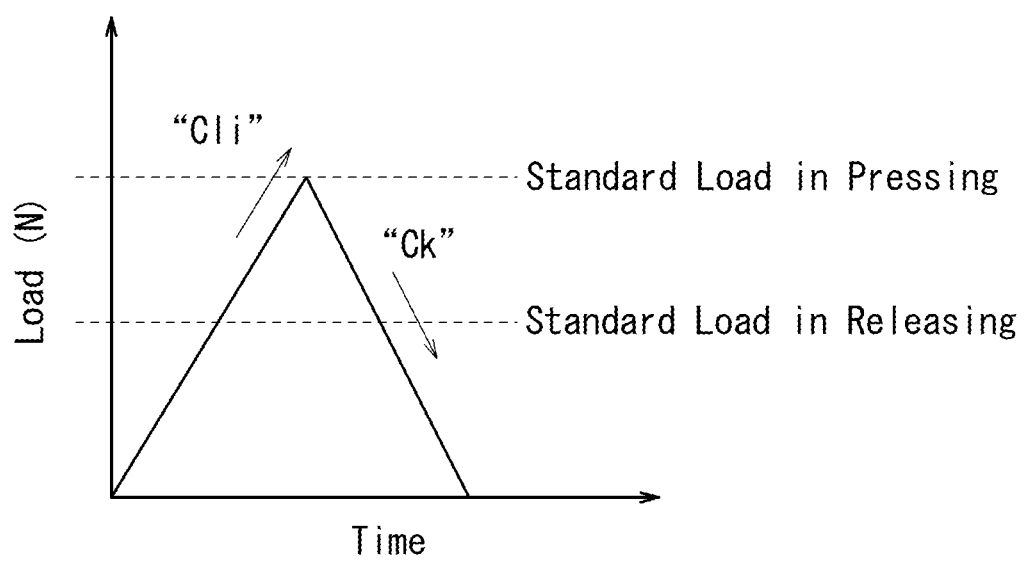
FIG. 17 is a diagram illustrating an example of click sensation provided by the input apparatus according to the third embodiment when the standard load of releasing is set to be less than that of pressing.

In a case where the standard load of releasing to drive the vibration unit 14 is set any load lower than that of pressing, even if the maximum load in pressing is the standard load of pressing, that is, even if an pressing object is pulled back at the standard load of pressing, it is possible to provide the click sensation in pressing and in releasing, as shown in FIG. 17. As shown in FIG. 16, in a case where the standard load of pressing to drive the vibration unit 14 and that of releasing are set to be equal, if the maximum load in pressing is equal to the standard load, the vibration unit 14 may not be driven in releasing. In addition, if the operator tried to maintain the pressure load at the standard load, an unexpected release tactile sensation may be provided. As a result, it may give the operator the feeling of strangeness. In contrast, if the standard load of releasing to drive the vibration unit 14 is set to any load lower than that of pressing, as shown in FIG. 17, it ensures to provide the release tactile sensation in releasing. Accordingly, it is possible to ensure that the operator is provided with the click sensation more similar to that of the push-button switch.

The following is a description of the results of sensory evaluations of the click sensation of the input apparatus according to the third embodiment examined by the inventors when the vibration unit 14 was driven only in pressing and when driven both in pressing and in releasing.

Figure 18:
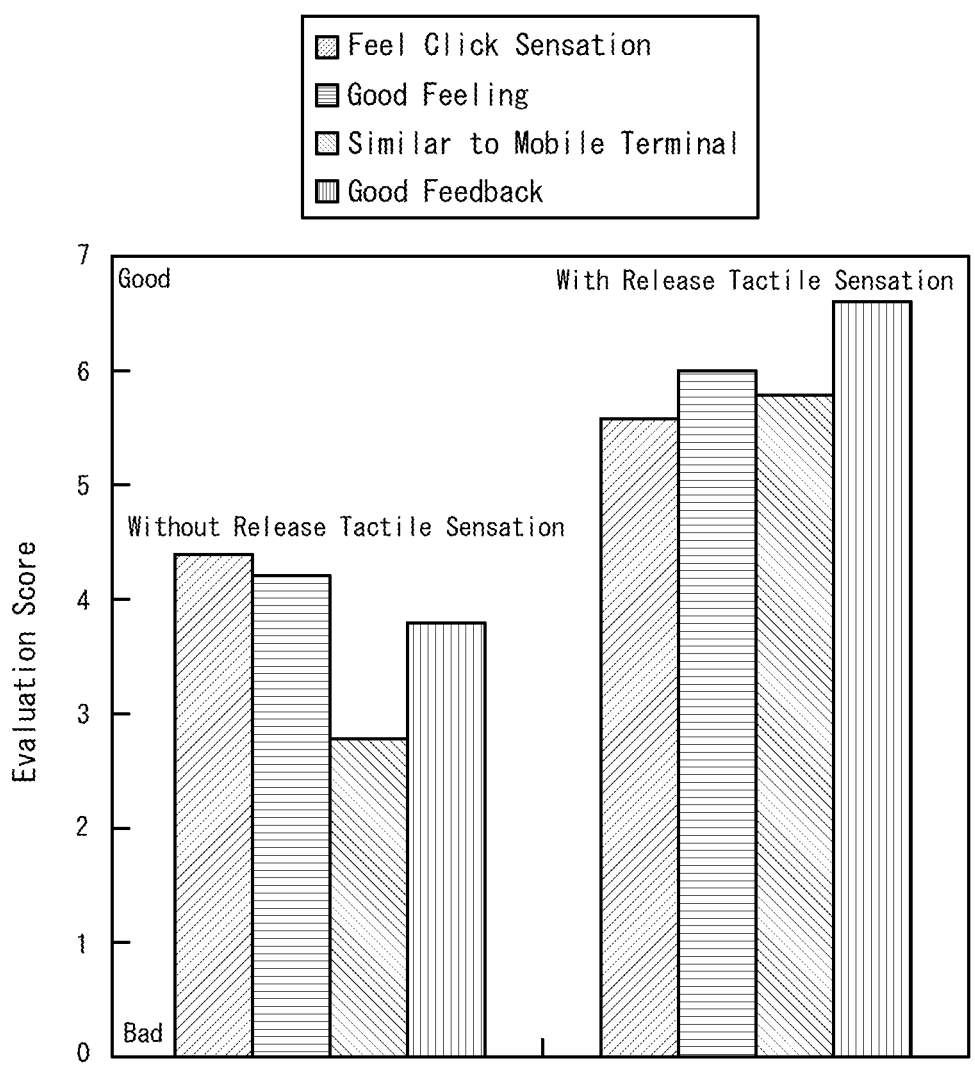
FIG. 18 is a diagram illustrating an exemplary result of sensory evaluations on the click sensation by the input apparatus according to the third embodiment comparing with and without a release tactile sensation.

FIG. 18 is a diagram illustrating exemplary results of such evaluations. In FIG. 18, bars on the left side represent results of the evaluations when the vibration unit 14 was driven only in pressing, that is, "without the release tactile sensation", whereas bars on the right side represent results of the evaluations when the vibration unit 14 was driven both in pressing and in releasing, that is, "with the release tactile sensation". The subjects were the five people involved in the sensory evaluations shown in FIG. 2 and FIG. 3. Evaluation items were four items including "good feedback (easy to percept)" in addition to the three evaluation items in FIG. 10 to FIG. 13. Each item is on a scale of 1 to 7 and the score of each item represents an average score of the five people. For the item "good feedback", "bad" scores 1 and "good" scores 7. In addition, the same predetermined standard load to drive the vibration unit 14 and the same drive signal are used in pressing and releasing. Here, the predetermined standard load was 1.5 N. In addition, the drive signal was 1 period of the sine wave with the frequency of 170 Hz and vibrated the touch panel 12, under the pressure of 1.5 N, by approximately 15 μm.

As can be seen in the results of the evaluations in FIG. 18, it was confirmed that, if the release tactile sensation is provided by vibrating the touch panel 12 in releasing as well, the click sensation becomes more similar to that of the mobile terminal and a good feedback (perception) can be obtained.

(Fourth Embodiment)

Incidentally, the input apparatus used in a mobile terminal, for example, is often used for a so-called repetitive tap to continuously input the same input object in inputting a phone number, a message and the like. In such a case, if the touch panel 12 is vibrated in the predetermined vibration pattern not only in pressing but also in releasing as shown in FIG. 18, it is necessary to appropriately set the predetermined standard load of releasing to drive the vibration unit 14.

Figure 19:
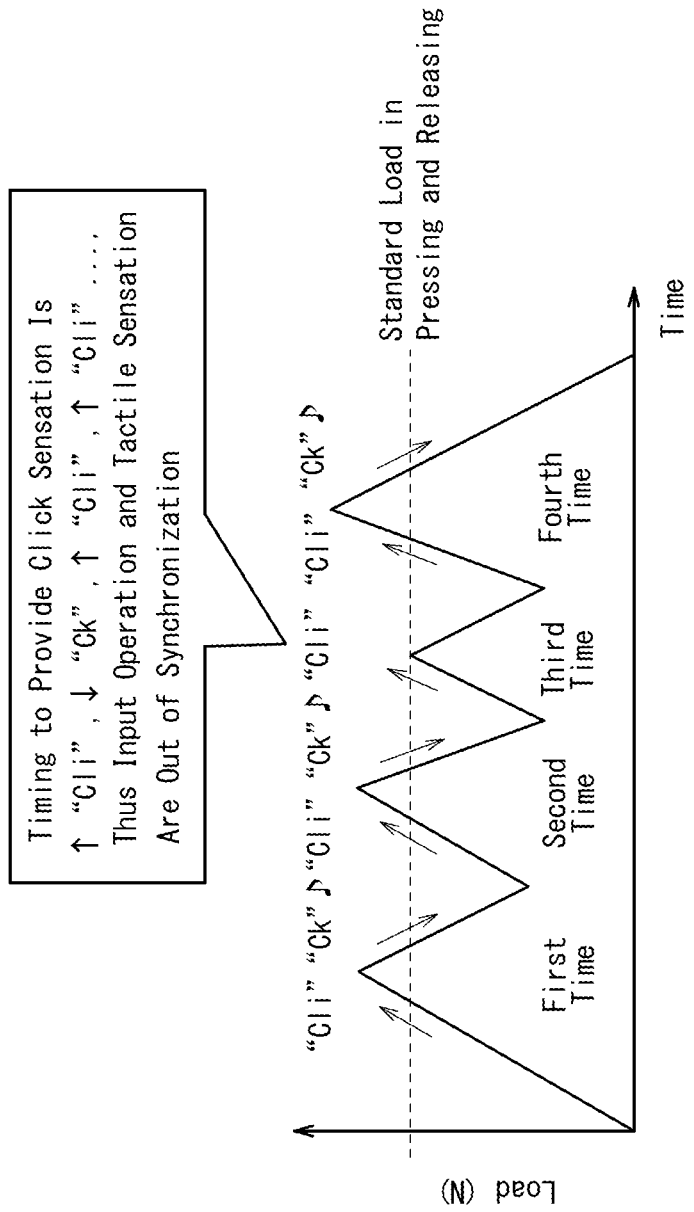
FIG. 19 is a diagram illustrating an example of sensation provided upon continuous input when the standard load of pressing and that of releasing are set to be equal.

That is, when the human quickly performs the continuous input, a next input is generally started before the pressure load returns to "0" and the maximum load in pressing varies. In such a case, if the predetermined standard load of pressing and that of releasing to drive the vibration unit 14 are set to be equal as described in the third embodiment, it may cause a phenomenon as shown in FIG. 19. That is, if the pressure load is pulled back at the standard load during the repetitive tap, for this input the vibration unit 14 may not be driven in releasing or the click sensation may be provided before the operator recognizes to have released. As a result, the input operation and the click sensation do not synchronize possibly giving the operator the feeling of strangeness. FIG. 19 shows a case where a pressure load on a third input in four continuous input is pulled back from the standard load.

Figure 20:
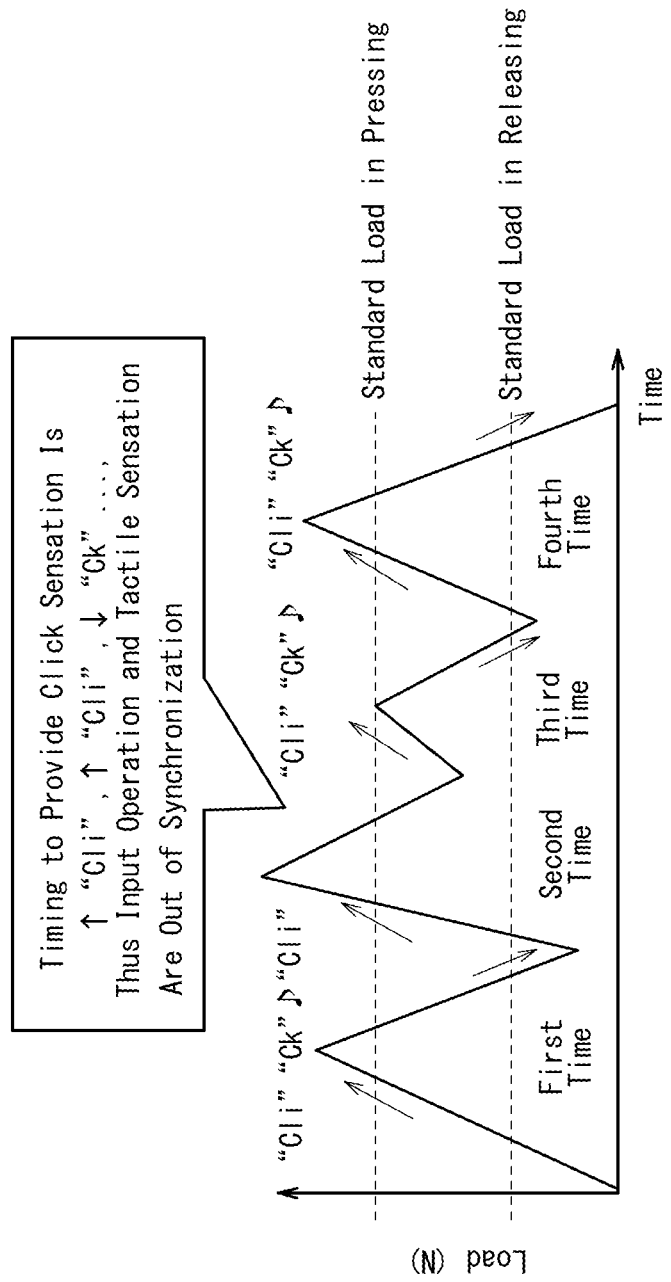
FIG. 20 is a diagram illustrating an example of sensation provided upon continuous input when the standard load of releasing is set to be too low relative to that of pressing.

On the other hand, if the predetermined standard load of releasing to drive the vibration unit 14 is set too low in comparison with a load to drive the vibration unit 14 in pressing, a phenomenon as shown in FIG. 20 may be caused. That is, if a next input is performed before the load returns to the standard load of releasing during the repetitive tap, the sensation is not provided in synchronization. As a result, it may give the operator the feeling of strangeness. FIG. 20 shows a case where a third input in a four repetitive taps is performed before a load of releasing a second input reaches the standard load of releasing. In addition, if the predetermined standard load of releasing is too low as stated above, it takes time to return thereto. As a result, the operator does not feel the feeling of strangeness by the tactile sensation provided but it takes time to allow a next input and thus prevents the operator from operating quick continuous input even if the operator desires it. Thereby, there is a concern that it may deteriorate operability at the continuous input (repetitive tap).

Figure 21:
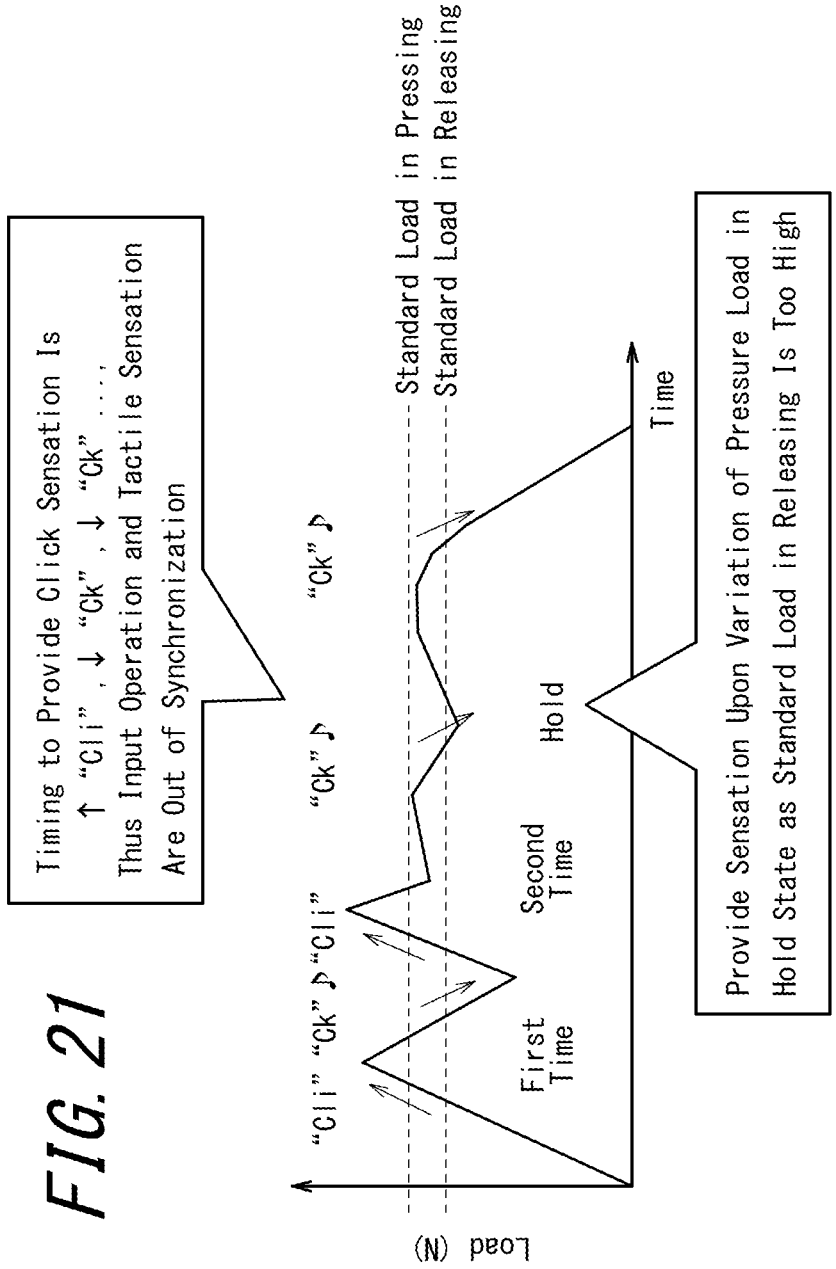
FIG. 21 is a diagram illustrating an example of sensation provided upon continuous input when the standard load of releasing is set close to that of pressing.

In contrast, if the predetermined standard load of releasing to drive the vibration unit 14 is set close to the load to drive the vibration unit 14 in pressing, it enables quicker continuous input. However, if the operator tries to maintain a pressed state (hold) during the continuous input, an unexpected release tactile sensation may be provided to the operator giving the feel of strangeness. That is, when the pressed state is held during the continuous input, the load slightly varies even though the operator intends to maintain the pressure load constant. Therefore, as shown in FIG. 21, for example, if a load range between the standard load of pressing and that of releasing is smaller than a load variation range in a holding state as described above, the operator is provided with the release tactile sensation despite thinking oneself holding and thus has the feeling of strangeness.

As such, according to the fourth embodiment of the present invention, it enables to deal with the above operability problem at the continuous input and slight variations in the load in the holding state, allowing the operator to perform continuous input smoothly with feeling the realistic click sensation. Therefore, the input apparatus according to the fourth embodiment, using the input apparatus in the third embodiment, sets the predetermined standard load of releasing to drive the vibration unit 14 at a value in a range of 50-80% of that of pressing.

The following is a description of results of sensory evaluations of the click sensation of the input apparatus according to the fourth embodiment examined by the inventors.

Figure 22:
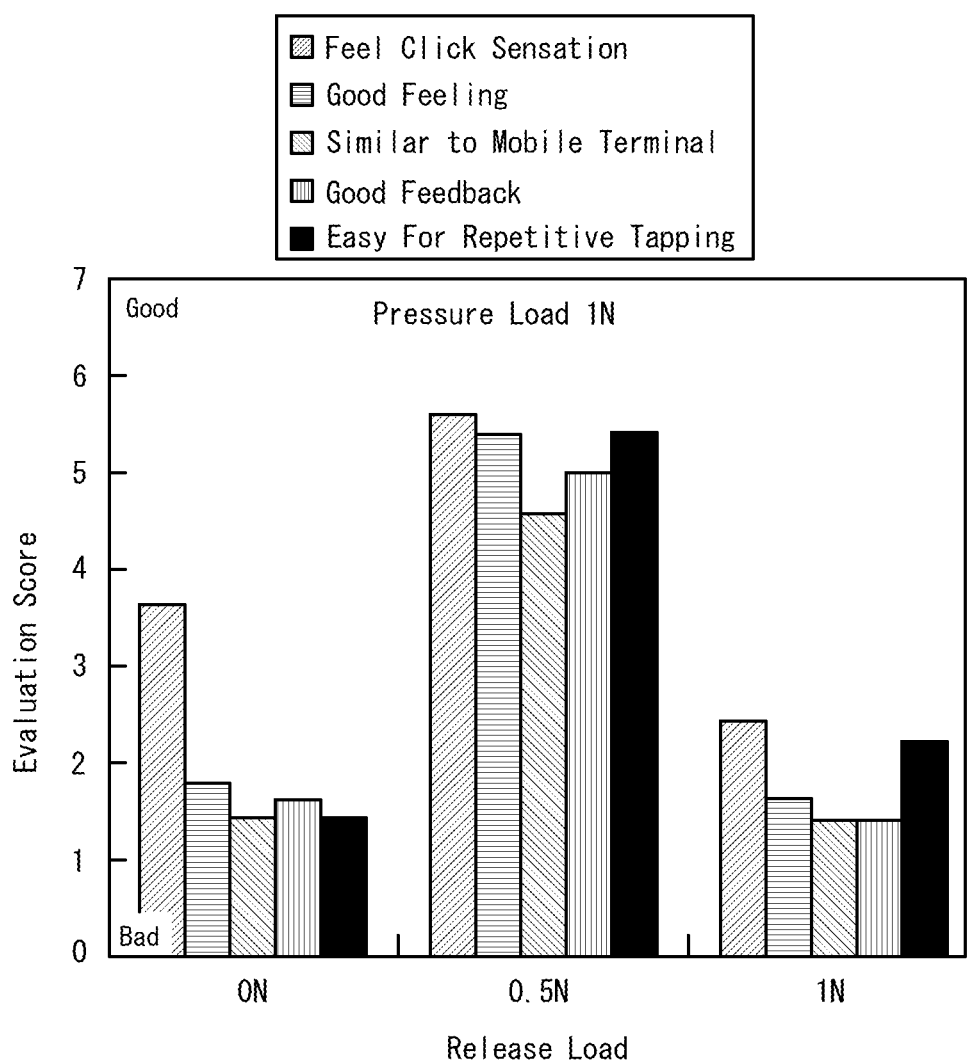
FIG. 22 is a diagram illustrating exemplary results of sensory evaluations on sensation provided by an input apparatus according to a fourth embodiment of the present invention when the standard load of pressing is set at 1 N.
Figure 23:
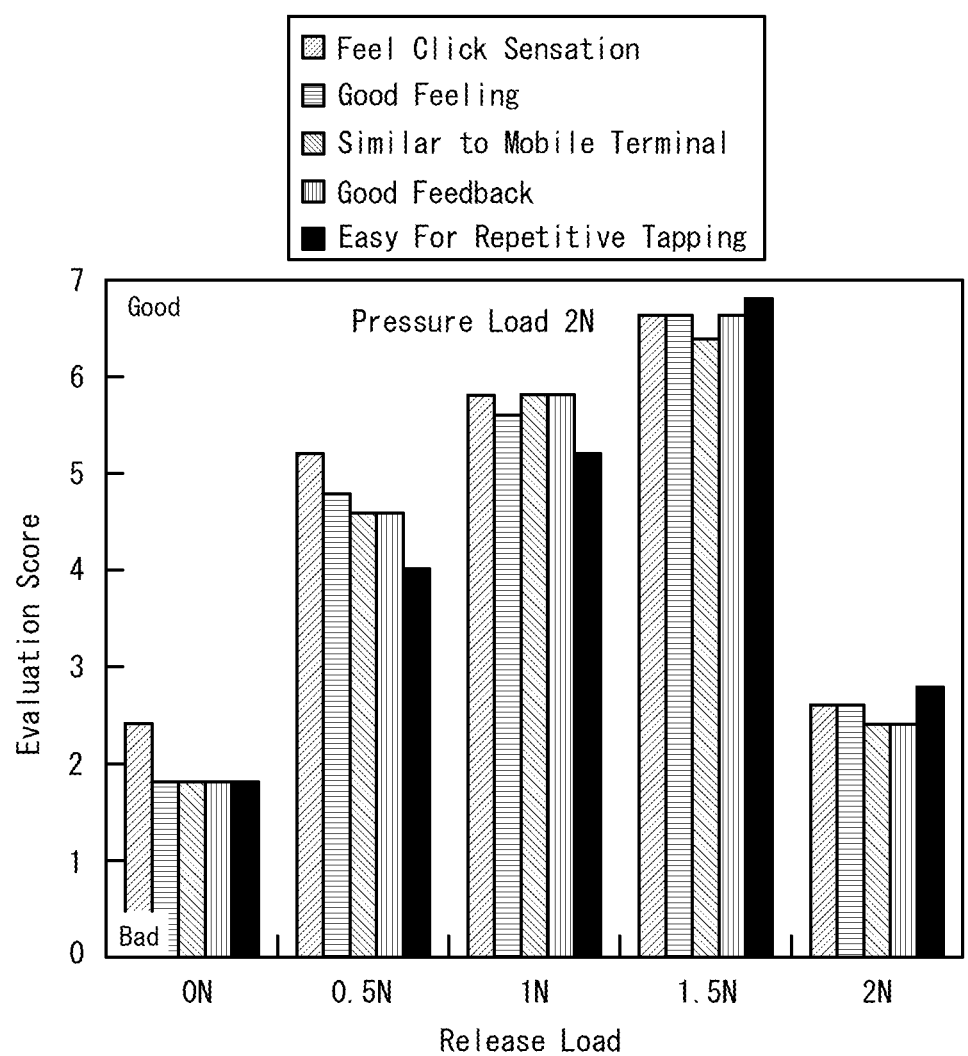
FIG. 23 is a diagram illustrating exemplary results of sensory evaluations on sensation provided by the input apparatus according to the fourth embodiment of the present invention when the standard load of pressing is set at 2 N.
Figure 24:
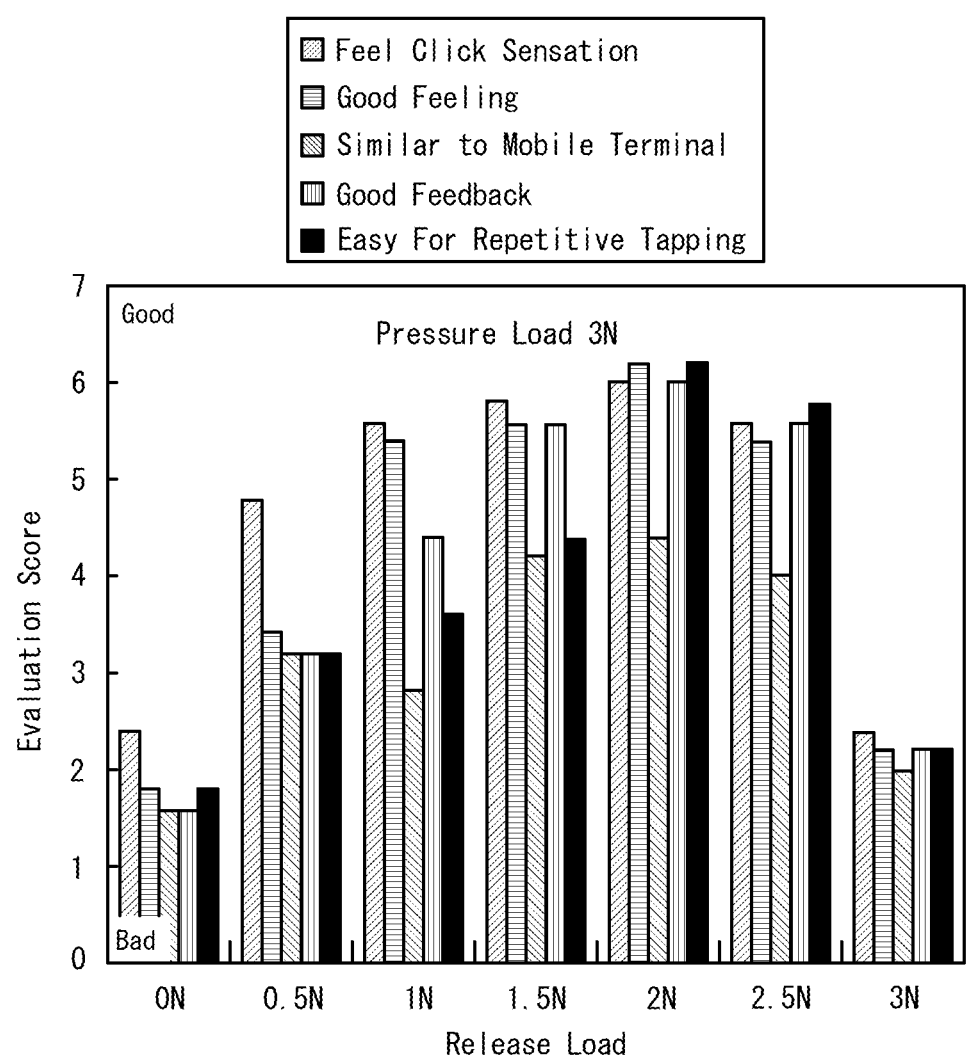
FIG. 24 is a diagram illustrating exemplary results of sensory evaluations on sensation provided by the input apparatus according to the fourth embodiment of the present invention when the standard load of pressing is set at 3 N.

FIG. 22 to FIG. 24 are diagrams illustrating the results of these evaluations. In FIG. 22 to FIG. 24, the subjects were the five people involved in the sensory evaluations shown in FIG. 18. Evaluation items were five items including "easy for repetitive tap" in addition to the four items in FIG. 18. Each item is on a scale of 1 to 7 and the score of each item represents an average score of the five people. For the item "easy for repetitive tap", "No" scores 1 and "Yes" scores 7. In addition, both in pressing and in releasing, the drive signal to drive the vibration unit 14 was 1 period of the sine wave with the frequency of 170 Hz, and vibrated the touch panel 12 by approximately 15 µm when each predetermined standard was satisfied.

FIG. 22 shows results of evaluations when the predetermined standard load in pressing was 1 N and the predetermined standard load of releasing was 0 N, 0.5 N and 1 N. As can be seen in FIG. 22, if the predetermined standard load to start vibration in pressing was 1 N, the highest evaluations for all items were obtained when the predetermined standard load to start vibration in releasing was 0.5 N.

FIG. 23 shows results of evaluations when the predetermined standard load in pressing was 2 N and the predetermined standard load in releasing was 0 N, 0.5 N, 1 N, 1.5 N and 2 N. As can be seen in FIG. 23, if the predetermined standard load to start vibration in pressing was 2 N, high evaluations were obtained when the predetermined standard load to start vibration in releasing was 1 N and 1.5 N. The highest evaluations for all items were obtained especially with 1.5 N.

FIG. 24 shows results of evaluations when the predetermined standard load in pressing was 3 N and the predetermined standard load in releasing was 0 N, 0.5 N, 1 N, 1.5 N, 2 N, 2.5 N and 3 N. As can be seen in FIG. 24, if the predetermined standard load to start vibration in pressing was 3 N, high evaluations were obtained when the predetermined standard load to start vibration in releasing was 1.5 N, 2 N and 2.5 N. The highest evaluations for all items were obtained especially with 2 N.

From the exemplary results of the evaluations described above, it was confirmed that, by setting the predetermined standard load of releasing to drive the vibration unit 14 to a value in the range of 50-80% of that of pressing, the realistic click sensation is provided by synchronizing a sequential input and timing to provide the feeling during the continuous input (repetitive tap) without giving the feeling of strangeness. That is, the predetermined standard load of releasing is set to be smaller than but equal to or over 50% of that of pressing. Thereby, the operability at the continuous input is dramatically improved without giving the feeling of strangeness. In addition, the predetermined standard load of releasing is set to be equal to or under 80% of that of pressing. Thereby, it is possible to deal with slight variations in the holding state during the continuous input.

Accordingly, if the predetermined standard load of pressing is set 1 N, for example, that of releasing is set at any value from 0.5 N to 0.8 N. In addition, if the predetermined standard load of pressing is high, the load variation range in the holding state is wider than that when the predetermined standard load is low. In such a case also, the predetermined standard load of releasing is set in the range of 50-80% of that of pressing. For example, if the predetermined standard load of pressing is set high, 6 N, the predetermined standard load in releasing is set to 3 N-4.8 N. Thereby, it is possible to provide the realistic click sensation in synchronization with the continuous input without providing unexpected release tactile sensation and giving the feeling of strangeness. The predetermined standard load of pressing and that of releasing may be set either fixedly or selectively arbitrarily by the user.

It is to be understood that the present invention is not limited to the embodiments set forth above and various modifications and changes may be implemented. For example, the load detection unit may be constituted of any number of strain gauge sensors. In addition, the load detection unit may be constituted according to an input detection scheme of the touch panel. For example, the load detection unit can be constituted without using the strain gauge sensor if the load can be detected from a change of an output signal based on a resistance change in accordance with a contact area in a case of employing the resistive film scheme or on a change in capacitance in a case of employing the capacitive scheme. In addition, the vibration unit may be constituted of any number of piezoelectric vibrators, transparent piezoelectric elements provided on an entire operation surface of the touch panel, or an eccentric motor which rotates 360 degrees in 1 period of the drive signal.

In addition, if the input apparatus has the display panel as shown in FIG. 5 and FIG. 6, the control unit may control so as to change a display state of a corresponding input object on the display panel by inversion or the like, upon receiving an input to the touch panel. Moreover, the control unit may be configured to change the drive signal to drive the vibration unit based on an input position detected on the touch panel so as to change the click sensation.

The present invention is applicable to an input apparatus with an input unit serving as one switch. Also, the input apparatus according to the present invention is capable of providing feelings of a multistep switch, such as a two-step switch (pressed further after pressed), by sequentially providing the click sensations on different standards (loads) while the input unit is being pressed. Thereby, if the input apparatus is applied to a release button of a camera, for example, it is possible to provide a feeling to lock focus (first step) and a feeling to release (second step). In addition, in combination with the display unit, it is possible to change a display of a menu screen and the like in a variety of manners in accordance with the step. Moreover, when providing the feelings of the multistep switch, it is possible to change the drive signal to vibrate the input unit by the vibration unit at each step in order to provide a different click sensation at each step.

According to the present invention, the vibration unit is driven when the pressure load detected by the load detection unit satisfies a predetermined standard for receiving an input. Here, "when the pressure load detected by the load detection unit satisfies the predetermined standard for receiving an input" may represent "when the pressure load detected by the load detection unit reaches the predetermined value for receiving the input", "when the pressure load detected by the load detection unit exceeds the predetermined value for receiving the input", or "when a predetermined value for receiving an input is detected by the load detection unit".

The control unit vibrates the input unit (touch panel) in a predetermined vibration pattern by driving the drive unit when the pressure load detected by the load detection unit satisfies the predetermined standard, and such predetermined vibration pattern in pressing may be one as shown by the solid line in FIG. 4, whereas that in releasing may be another as shown by the dashed line in FIG. 4. Vibration of the input unit in those manners enables to provide the operator with the click sensation (vibration stimulus) the same as that obtained when operating the push-button switch.

REFERENCE SIGNS LIST 11 display panel
12 touch panel
13 load detection unit
14 vibration unit
15 control unit
21 housing
22 insulator
23 upper cover
24 insulator
31 strain gauge sensor
32 ultrasonic transducer
41 touch panel
41a input object
42 position detection unit
43 display panel
44 load detection unit
45 vibration unit
46 control unit

The invention claimed is:

1. An input apparatus comprising:
an input unit for receiving a pressure input;
a vibration unit for vibrating the input unit; and
a control unit for controlling drive of the vibration unit such that a click sensation is provided to an object pressing the input unit, wherein
the drive depends on a pressure on the input unit, wherein the pressure is after an initial contact of the input unit, and
the vibration unit is configured of piezoelectric.

2. An input apparatus comprising:
an input unit for receiving a pressure;
a vibration unit for vibrating the input unit; and
a control unit for controlling drive of the vibration unit to vibrate the input unit at a frequency such that a click sensation is provided to an object pressing the input unit, wherein
the drive depends on a pressure on the input unit, wherein the pressure is after an initial contact of the input unit, and
the vibration unit is configured of piezoelectric.

3. An input apparatus comprising:
an input unit for receiving a pressure input;
a vibration unit for vibrating the input unit; and
a control unit for controlling drive of the vibration unit such that a click sensation is provided to an object pressing the input unit, and for controlling drive of the vibration unit such that the click sensation is provided to the object after the input to the input unit is received, wherein
the drive depends on a pressure on the input unit, wherein the pressure is after an initial contact of the input unit, and
the vibration unit is configured of piezoelectric.

* * * * *